United States Patent
Nishikawa et al.

(10) Patent No.: US 9,792,858 B2
(45) Date of Patent: Oct. 17, 2017

(54) DISPLAY DEVICE AND METHOD FOR DRIVING SAME

(71) Applicant: Sharp Kabushiki Kaisha, Sakai, Osaka (JP)

(72) Inventors: Daichi Nishikawa, Sakai (JP); Noritaka Kishi, Sakai (JP); Masanori Ohara, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/321,340

(22) PCT Filed: Jun. 23, 2015

(86) PCT No.: PCT/JP2015/067964
§ 371 (c)(1),
(2) Date: Dec. 22, 2016

(87) PCT Pub. No.: WO2015/199051
PCT Pub. Date: Dec. 30, 2015

(65) Prior Publication Data
US 2017/0140703 A1    May 18, 2017

(30) Foreign Application Priority Data

Jun. 23, 2014 (JP) .................................. 2014-128120

(51) Int. Cl.
    G09G 3/3233    (2016.01)
    G11C 19/00     (2006.01)
    (Continued)

(52) U.S. Cl.
    CPC ......... *G09G 3/3233* (2013.01); *G09G 3/3266* (2013.01); *G09G 3/3283* (2013.01);
    (Continued)

(58) Field of Classification Search
    CPC .. G09G 3/3233; G09G 3/3255; G09G 3/3283; G09G 2310/0286;
    (Continued)

(56) References Cited

U.S. PATENT DOCUMENTS

2007/0210996 A1    9/2007  Mizukoshi et al.
2010/0245331 A1    9/2010  Shirouzu et al.
(Continued)

FOREIGN PATENT DOCUMENTS

JP    2005284172 A    10/2005
JP    2012-009125 A    1/2012
(Continued)

OTHER PUBLICATIONS

International Search Report PCT/ISA/210 for International Application No. PCT/JP2015/067964 Dated Sep. 10, 2016.
(Continued)

*Primary Examiner* — Larry Sternbane
(74) *Attorney, Agent, or Firm* — Steven Reiss

(57) ABSTRACT

A scanning line drive circuit includes a shift register having stages, hold circuits, and scanning signal output circuits. The hold circuit holds a shift register output in accordance with a sampling signal which is in an active level in one line period in a video signal period. The scanning signal output circuit outputs a scanning signal to be applied to scanning lines based on the shift register output, a hold output, a period specifying signal indicating whether it is in the video signal period or in a vertical flyback period, and timing signals. The scanning signal output circuit outputs a scanning signal for measurement and writing when the hold output is in a selection level in the vertical flyback period. It is possible to select a scanning line corresponding to the pixel circuits in one row and measure currents or voltages in the vertical flyback period, using a simple circuit.

19 Claims, 21 Drawing Sheets

(51) Int. Cl.
*G09G 3/3266* (2016.01)
*G09G 3/3283* (2016.01)

(52) U.S. Cl.
CPC ....... *G11C 19/00* (2013.01); *G09G 2300/043* (2013.01); *G09G 2310/0202* (2013.01); *G09G 2310/027* (2013.01); *G09G 2310/0286* (2013.01); *G09G 2320/0646* (2013.01)

(58) Field of Classification Search
CPC ... G09G 2310/0202; G09G 2320/0646; G09G 2300/043; G09G 2310/027; G11C 19/00
See application file for complete search history.

(56) References Cited

U.S. PATENT DOCUMENTS

2011/0285675 A1  11/2011  Amano et al.
2012/0138922 A1   6/2012  Yamazaki et al.

FOREIGN PATENT DOCUMENTS

| | | |
|---|---|---|
| JP | 2012134475 A | 7/2012 |
| WO | WO-2010/001594 A1 | 1/2010 |
| WO | WO-2014/174905 A1 | 10/2014 |
| WO | WO-2014/203810 A1 | 12/2014 |
| WO | WO-2014208459 A1 | 12/2014 |
| WO | WO-2015/037331 A1 | 3/2015 |
| WO | WO-2015093100 A1 | 6/2015 |
| WO | WO-2015162650 A1 | 10/2015 |
| WO | WO-2015190407 A1 | 12/2015 |

OTHER PUBLICATIONS

Written Opinion of the International Searching Authority PCT/ISA/237 for International Application No. PCT/JP2015/067964 dated Sep. 10, 2015.

DISPLAY DEVICE AND METHOD FOR DRIVING SAME

TECHNICAL FIELD

The present invention relates to a display device, and more particularly to an active-matrix type display device including an electro-optical element such as an organic EL element, and a driving method of the display device.

BACKGROUND ART

In recent years, an organic EL (Electro Luminescence) display device has been receiving attention as a thin, lightweight, fast response display device. The organic EL display device includes a plurality of pixel circuits arranged two-dimensionally. The pixel circuit of the organic EL display device includes an organic EL element and a drive transistor provided in series with the organic EL element. The drive transistor controls an amount of a current flowing through the organic EL element, and the organic EL element emits light at luminance in accordance with the amount of the flowing current.

The organic EL display device has a problem that luminance of a pixel drops with operating time. The reason why luminance of the pixel drops is that a light-emitting efficiency of the organic EL element decreases and characteristics of the drive transistor (e.g., threshold voltage) fluctuates with the operating time. As a method for solving this problem, there is known a method in which a current flowing inside the pixel circuit is read out from the pixel circuit via a data line and the like, and a video signal is corrected based on a result of measuring the read-out current (e.g., Patent Document 1).

Further, in relation to the present invention, Patent Document 2 describes a shift register in which pulse output circuits shown in FIG. 24 are connected in multi-stage. In FIG. 24, an output terminal O1 is connected to the pulse output circuit in the next stage, and an output terminal O2 is connected to a scanning line. A low level voltage VSS1 is applied to a power supply line connected to a transistor Q92, and a variable voltage VSS2 is applied to a power supply line connected to a transistor Q94. The variable voltage VSS2 is controlled to the low level voltage VSS1 in a normal mode, and is controlled to a high level voltage VDD or the low level voltage of VSS1 in an all-at-once mode. In the all-at-once mode, it is possible to output a scanning signal for display to a plurality of scanning lines collectively at the same timing.

PRIOR ART DOCUMENTS

Patent Documents

[Patent Document 1] Japanese Laid-Open Patent Publication No. 2005-284172
[Patent Document 2] Japanese Laid-Open Patent Publication No. 2012-9125

SUMMARY OF THE INVENTION

Problems to be Solved by the Invention

In an active-matrix type display device, one frame period is divided into a video signal period in which pixel circuits are selected sequentially on a row by row basis and data voltages are written to the pixel circuits in the selected row, and a vertical flyback period in which the data voltages are not written to the pixel circuits. When a video signal is to be corrected based on a result of measuring a current which flows inside the pixel circuit, there can be considered a method of performing a current measurement processing in the video signal period, and a method of performing the current measurement processing in the vertical flyback period.

As a method for measuring currents with respect to the pixel circuits in a plurality of rows in one video signal period, there can be considered a method of selecting a plurality of line periods in the video signal period, extending the selected line periods, and writing the data voltages and measuring the currents in the extended line periods. In this method, scanning lines G1 to Gn are selected according to a timing shown in FIG. 25. However, the lengths of the line periods are different from each other in this method, which makes data transmission timing from a display control circuit to a data line drive circuit irregular. Thus, this method has a problem that a frame memory or a line memory having several ten lines is necessary for data transmission.

On the contrary, when the currents are measured with respect to the pixel circuits in one row in one vertical flyback period, a line memory having one or two lines is enough for data transmission. However, in this case, it is necessary to consider a configuration of a scanning line drive circuit. Conventional and typical scanning line drive circuits do not have a function of outputting a selection level signal in the vertical flyback period, instead outputs a non-selection level signal during the vertical flyback period. Further, when the function of outputting the selection level signal in the vertical flyback period is to be added to the conventional scanning line drive circuit, the configuration of the scanning line drive circuit or the display control circuit becomes complicated if there is no special contrivance. Similar problems occur in a display device in which the video signal is corrected based on a result of measuring a voltage of a node in the pixel circuit.

Accordingly, an object of the present invention is to provide a display device which selects one scanning line in the vertical flyback period and measures currents or voltages with respect to the pixel circuits in one row, by using a simple circuit.

Means for Solving the Problems

According to a first aspect of the present invention, there is provided an active-matrix type display device including: a display unit including a plurality of scanning lines, a plurality of data lines, and a plurality of pixel circuits arranged two-dimensionally; a scanning line drive circuit configured to drive the scanning lines; a data line drive circuit configured to have a function of driving the data lines and a function of measuring a current or a voltage with respect to the pixel circuit; and a display control circuit configured to output a period specifying signal indicating whether it is in a video signal period or in a non-video signal period and a sampling signal which is in an active level in one line period in the video signal period, wherein the scanning line drive circuit includes a shift register having a plurality of stages corresponding to the scanning lines, a plurality of hold circuits provided corresponding to the scanning lines, each configured to hold a shift register output in accordance with the sampling signal, the shift register output being output from a corresponding stage of the shift register, and a scanning signal output circuit provided corresponding to the scanning lines, and configured to output a scanning signal to be applied to a corresponding scanning line, based on at least the period specifying signal, the shift register output, and a hold output which is output from a corresponding hold circuit.

According to a second aspect of the present invention, in the first aspect of the present invention, the scanning signal output circuit is configured to output a scanning signal for writing when the shift register output is in a selection level in the video signal period, and output a scanning signal for measurement and writing when the hold output is in the selection level in the non-video signal period.

According to a third aspect of the present invention, in the second aspect of the present invention, the plurality of the scanning lines includes a plurality of first scanning lines and a plurality of second scanning lines, the display control circuit is configured to further output a first timing signal and a second timing signal, and the scanning signal output circuit is configured to output the shift register output as a first scanning signal to be applied to the first scanning line and output a non-selection level signal as a second scanning signal to be applied to the second scanning line in the video signal period, and is configured to output as the first scanning signal a signal based on the hold output and the first timing signal and output as the second scanning signal a signal based on the hold output and the second timing signal in the non-video signal period.

According to a fourth aspect of the present invention, in the third aspect of the present invention, the pixel circuit includes an electro-optical element, a drive transistor provided in series with the electro-optical element, a write control transistor provided between the data line and a control terminal of the drive transistor, and having a control terminal connected to the first scanning line, a read control transistor provided between the data line and one conduction terminal of the drive transistor, and having a control terminal connected to the second scanning line, and a capacitor provided between the control terminal and the other conduction terminal of the drive transistor.

According to a fifth aspect of the present invention, in the fourth aspect of the present invention, the first timing signal is in a non-selection level in a part of the non-video signal period, and is in the selection level otherwise, the second timing signal is in the selection level in a part of a period in which the first timing signal is in the non-selection level, and is in the non-selection level otherwise, and the scanning signal output circuit is configured to, in the non-video signal period, output as the first scanning signal a signal which is in the selection level when the hold output and the first timing signal are in the selection level, and output as the second scanning signal a signal which is in the selection level when the hold output and the second timing signal are in the selection level.

According to a sixth aspect of the present invention, in the second aspect of the present invention, the scanning signal output circuit is configured to output the shift register output as the scanning signal in the video signal period, and output the hold output as the scanning signal in the non-video signal period.

According to a seventh aspect of the present invention, in the sixth aspect of the present invention, the display unit further includes a plurality of monitor lines, and the pixel circuit includes an electro-optical element, a drive transistor provided in series with the electro-optical element, a write control transistor provided between the data line and a control terminal of the drive transistor, and having a control terminal connected to the scanning line, a read control transistor provided between the monitor line and one conduction terminal of the drive transistor, and having a control terminal connected to the scanning line, and a capacitor provided between the control terminal and the one conduction terminal of the drive transistor.

According to an eighth aspect of the present invention, in the sixth aspect of the present invention, the pixel circuit includes an electro-optical element, a drive transistor provided in series with the electro-optical element, a write control transistor provided between the data line and one conduction terminal of the drive transistor, and having a control terminal connected to the scanning line, a reference voltage applying transistor provided between a control terminal of the drive transistor and a wiring having a reference voltage, and having a control terminal connected to the scanning line, and a capacitor provided between the control terminal and the one conduction terminal of the drive transistor.

According to a ninth aspect of the present invention, in the second aspect of the present invention, the display control circuit is configured to further output a clear signal which is changed to the active level at the end of the non-video signal period, and an output of the hold circuit is changed to a non-selection level in accordance with the clear signal.

According to a tenth aspect of the present invention, in the second aspect of the present invention, the display control circuit is configured to switch a line period in which an active level sampling signal is output, every plural frame periods.

According to an eleventh aspect of the present invention, in the tenth aspect of the present invention, the display control circuit is configured to switch the line period in which the active level sampling signal is output, every plural frame periods sequentially.

According to a twelfth aspect of the present invention, in the tenth aspect of the present invention, the display control circuit is configured to switch the line period in which the active level sampling signal is output, every plural frame periods sequentially with skipping a predetermined number of line periods.

According to a thirteenth aspect of the present invention, in the tenth aspect of the present invention, the display control circuit is configured to switch the line period in which the active level sampling signal is output, every plural frame periods at random.

According to a fourteenth aspect of the present invention, in the tenth aspect of the present invention, the display control circuit is configured to switch the line period in which the active level sampling signal is output, every plural frame periods with giving a priority to line periods in a specific range.

According to a fifteenth aspect of the present invention, in the second aspect of the present invention, the data line drive circuit is configured to apply to the data line a voltage corrected according to luminance drop of the pixel circuit when writing the voltage to the pixel circuit selected in the non-video signal period from among the plurality of the pixel circuits.

According to a sixteenth aspect of the present invention, in the second aspect of the present invention, the display device further includes a correction calculation unit configured to correct a video signal based on the current or the voltage measured by the data line drive circuit.

According to a seventeenth aspect of the present invention, in the second aspect of the present invention, the data line drive circuit is configured to measure a current that is output from the pixel circuit when a measurement voltage is written to the pixel circuit.

According to an eighteenth aspect of the present invention, in the second aspect of the present invention, the data line drive circuit is configured to measure a voltage of a node in the pixel circuit when a measurement current flows through the pixel circuit.

According to a nineteenth aspect of the present invention, there is provided a driving method of an active-matrix type display device having a display unit including a plurality of scanning lines, a plurality of data lines, and a plurality of pixel circuits arranged two-dimensionally, the method including the steps of: driving the scanning lines by using a scanning line drive circuit; driving the data lines and measuring a current or a voltage with respect to the pixel circuit; and outputting a period specifying signal indicating whether it is in a video signal period or in a non-video signal period and a sampling signal which is in an active level in one line period in the video signal period, wherein the scanning line drive circuit includes a shift register having a plurality of stages corresponding to the scanning lines, a plurality of hold circuits provided corresponding to the scanning lines, each configured to hold a shift register output in accordance with the sampling signal, the shift register output being output from a corresponding stage of the shift register, and a scanning signal output circuit provided corresponding to the scanning lines, and configured to output a scanning signal to be applied to a corresponding scanning line, based on at least the period specifying signal, the shift register output, and a hold output which is output from a corresponding hold circuit.

Effects of the Invention

According to the first or nineteenth aspect of the present invention, since the plurality of hold circuits hold the shift register outputs in a line period in the video signal period, one hold output is changed to the selection level in a vertical flyback period in the non-video signal period. In the vertical flyback period, the scanning signal output circuit outputs a scanning signal different from that in the video signal period. Therefore, it is possible to select a scanning line corresponding to the pixel circuits in one row, and measure currents or voltages and perform writing with respect to the pixel circuits in one row in the vertical flyback period, by using a simple circuit.

According to the second aspect of the present invention, it is possible to select the scanning lines sequentially and apply the scanning signal for writing to the selected scanning line in the video signal period, and select one scanning line and apply the scanning signal for measurement and writing to the selected scanning line in the vertical flyback period in the non-video signal period. Therefore, it is possible to select the scanning line corresponding to the pixel circuits in one row, and measure currents or voltages and perform writing with respect to the pixel circuits in one row in the vertical flyback period, by using a simple circuit.

According to the third aspect of the present invention, in a display device having two kinds of scanning lines, it is possible to select one pair of scanning lines, and measure currents or voltages and perform writing with respect to the pixel circuits in one row in the vertical flyback period in the non-video signal period.

According to the fourth aspect of the present invention, in a display device having pixel circuits, each including an electro-optical element, three transistors, and a capacitor, it is possible to select one pair of scanning lines, and measure currents or voltages and perform writing with respect to the pixel circuits in one row in the vertical flyback period in the non-video signal period.

According to the fifth aspect of the present invention, the scanning signal for measurement and writing to be applied to two kinds of scanning lines can be obtained by supplying two kinds of timing signals to the scanning signal output circuit.

According to the sixth aspect of the present invention, in a display device having one kind of scanning lines, it is possible to select one scanning line, and measure currents or voltages and perform writing with respect to the pixel circuits in one row in the vertical flyback period in the non-video signal period.

According to the seventh aspect of the present invention, in a display device having pixel circuits, each including an electro-optical element, three transistors, and a capacitor, and monitor lines, it is possible to select one scanning line, and measure currents or voltages and perform writing with respect to the pixel circuits in one row in the vertical flyback period in the non-video signal period.

According to the eighth aspect of the present invention, in a display device having pixel circuits, each including an electro-optical element, three transistors, and a capacitor, and a wiring having a reference voltage, it is possible to select one scanning line, and measure currents or voltages and perform writing with respect to the pixel circuits in one row in the vertical flyback period in the non-video signal period.

According to the ninth aspect of the present invention, the output of the hold circuit can be changed to the non-selection level at the end of the non-video signal period by using the clear signal.

According to the tenth aspect of the present invention, the same scanning line is selected consecutively in the vertical flyback periods in the non-video signal periods, thus it is possible to measure a current or a voltage with respect to the same pixel circuit a plurality of times with changing conditions.

According to the eleventh aspect of the present invention, it is possible to measure a current or a voltage with respect to the two-dimensionally arranged pixel circuits sequentially on a row-by-row basis.

According to the twelfth aspect of the present invention, the current or the voltage is measured with respect to the two-dimensionally arranged pixel circuits, sequentially by a row-by-row basis with skipping a plurality of rows, thus it is possible to disperse effects of the measurement in a display image, and prevent degradation of an image quality of the display image.

According to the thirteenth aspect of the present invention, the row of the pixel circuits with respect to which currents or voltages are measured is switched at random among the two-dimensionally arranged pixel circuits, thus it is possible to disperse effects of the measurement in the display image, and prevent the degradation of the image quality of the display image.

According to the fourteenth aspect of the present invention, the current or the voltage is measured on a row-by-row basis, with providing a priority to the pixel circuits in rows in a specific range among the two-dimensionally arranged pixel circuits, thus it is possible to measure the current or the voltage preferentially with respect to the pixel circuits which gives large effects on the image quality of the display image, and improve the image quality of the display image.

According to the fifteenth aspect of the present invention, the corrected voltage is written to the pixel circuit with respect to which the current or the voltage is measured, thus it is possible to prevent luminance drop at the pixel circuit with respect to which the current or the voltage is measured, and prevent the degradation of the image quality of the display image.

According to the sixteenth aspect of the present invention, the video signal is corrected based on the measurement result of the current or the voltage, thus it is possible to compensate for luminance drop of the pixel circuit, and improve the image quality of the display image.

According to the seventeenth aspect of the present invention, it is possible to select a scanning line corresponding to the pixel circuits in one row, measure currents that are output from the pixel circuits when the measurement voltage is written, with respect to the pixel circuits in one row in the vertical flyback period, by using a simple circuit.

According to the eighteenth aspect of the present invention, it is possible to select a scanning line corresponding to the pixel circuits in one row, measure voltages of nodes in the pixel circuits when a measurement current flows, with respect to the pixel circuits in one row in the vertical flyback period, by using a simple circuit.

MODES FOR CARRYING OUT THE INVENTION

First Embodiment

Figure 1:
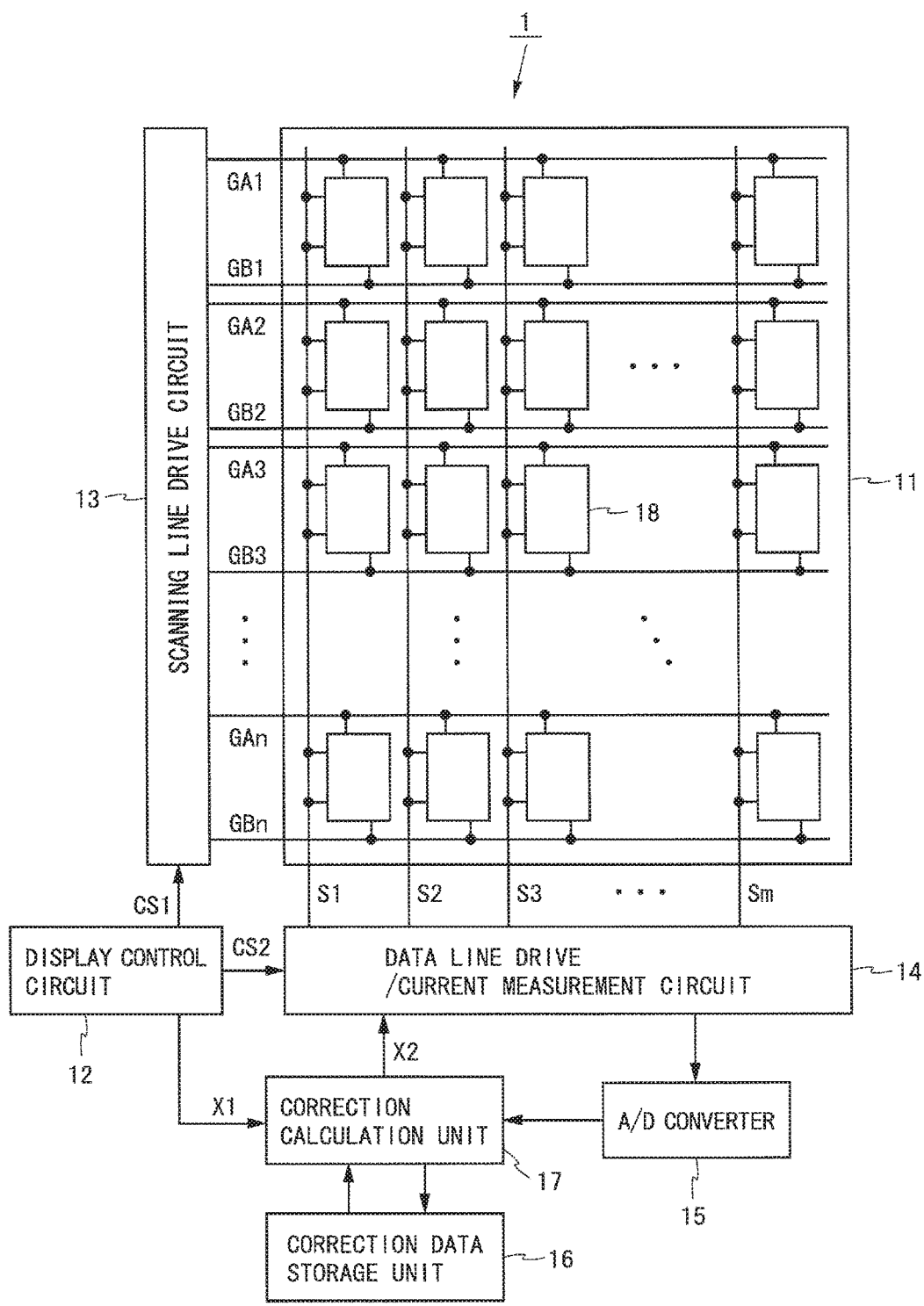
FIG. 1 is a block diagram showing a configuration of a display device according a first embodiment of the present invention.

FIG. 1 is a block diagram showing a configuration of a display device according to a first embodiment of the present invention. A display device 1 shown in FIG. 1 is an active-matrix type organic EL display device including a display unit 11, a display control circuit 12, a scanning line drive circuit 13, a data line drive/current measurement circuit 14, an A/D converter 15, a correction data storage unit 16, and a correction calculation unit 17. Hereinafter, m and n are integers not smaller than 2, i is an integer not smaller than 1 and not larger than n, and j is an integer not smaller than 1 and not larger than m.

The display unit 11 includes $2n$ scanning lines GA1 to GAn, GB1 to GBn, m data lines S1 to Sm, and (m×n) pixel circuits 18. The scanning lines GA1 to GAn, GB1 to GBn are arranged in parallel to each other. The data lines S1 to Sm are arranged in parallel to each other so as to intersect with the scanning lines GA1 to GAn, GB1 to GBn perpendicularly. The scanning lines GA1 to GAn and the data lines S1 to Sm intersect at (m×n) points. The (m×n) pixel circuits 18 are arranged two-dimensionally corresponding to the intersections of the scanning lines GA1 to GAn and the data lines S1 to Sm. A high level power supply voltage ELVDD and a low level power supply voltage ELVSS are supplied to the pixel circuit 18 by using electrodes not shown. Hereinafter, an extending direction of the scanning line (horizontal direction in FIG. 1) is referred to as a row direction, and an extending direction of the data line (vertical direction in FIG. 1) is referred to as a column direction.

The display control circuit 12 is a control circuit of the display device 1. The display control circuit 12 outputs a control signal CS1 to the scanning line drive circuit 13, outputs a control signal CS2 to the data line drive/current measurement circuit 14, and outputs a video signal X1 to the correction calculation unit 17. The control signal CS2 includes a source start pulse, a source clock, and the like, for example. Details of the control signal CS1 will be described later.

In the display device 1, one frame period is divided into a video signal period and a vertical flyback period (refer to FIG. 4 described later). The video signal period includes n line periods (also referred to as horizontal period) corresponding to n rows of the pixel circuits 18. The scanning line drive circuit 13 drives the scanning lines GA1 to GAn, GB1 to GBn according to the control signal CS1. More specifically, in an i-th line period, the scanning line drive circuit 13 controls a voltage of a scanning line GAi to a high level (selection level), and controls voltages of the other scanning lines to a low level (non-selection level). In the vertical flyback period, the scanning line drive circuit 13 selects one pair of scanning lines GAi, GBi from among the scanning lines GA1 to GAn, GB1 to GBn, applies scanning signals described later to the scanning lines GAi, GBi, and controls the voltages of the other scanning lines to the low level. The scanning lines GAi, GBi selected in the vertical flyback period are switched every four frame periods.

The control signal CS2, and a corrected video signal X2 output from the correction calculation unit 17 are supplied to the data line drive/current measurement circuit 14. The data line drive/current measurement circuit 14 is a data line drive circuit having a function of driving the data lines S1 to Sm and a function of measuring currents that are output from the pixel circuits 18 to the data lines S1 to Sm. More specifically, in the video signal period, according to the control signal CS2, the data line drive/current measurement circuit 14 applies to the data lines S1 to Sm m voltages (hereinafter referred to as data voltage) in accordance with the video signal X2, respectively. In the vertical flyback period, according to the control signal CS2, the data line drive/current measurement circuit 14 applies m measurement voltages to the data lines S1 to Sm respectively, converts to voltages m pieces of currents that are output from the pixel circuits 18 to the data lines S1 to Sm, and outputs the obtained voltages.

The A/D converter 15 converts output voltages of the data line drive/current measurement circuit 14 to digital data. The correction data storage unit 16 stores data (hereinafter referred to as correction data) which is necessary to a correction calculation by the correction calculation unit 17. In the vertical flyback period, the correction calculation unit 17 updates the correction data stored in the correction data storage unit 16, based on the data output from the A/D converter 15. In the video signal period, the correction calculation unit 17 corrects the video signal X1 which is output from the display control circuit 12, referring to the correction data stored in the correction data storage unit 16, and outputs the corrected video signal X2.

Figure 2:
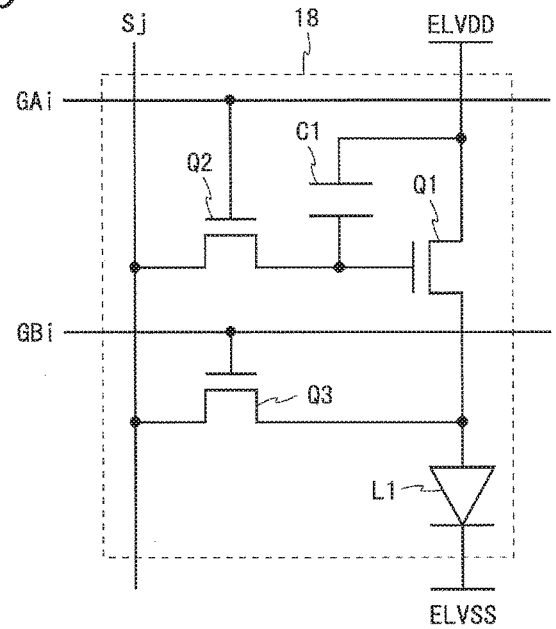
FIG. 2 is a circuit diagram of a pixel circuit in the display device shown in FIG. 1.

FIG. 2 is a circuit diagram of the pixel circuit 18 in an i-th row and a j-th column. As shown in FIG. 2, the pixel circuit 18 includes an organic EL element L1, transistors Q1 to Q3, and a capacitor C1, and is connected to scanning lines GAi, GBi and a data line Sj. Each of the transistors Q1 to Q3 is an N-channel type TFT (Thin Film Transistor). The high level power supply voltage ELVDD is applied to a drain terminal of the transistor Q1. A source terminal of the transistor Q1 is connected to an anode terminal of the organic EL element L1. The low level power supply voltage ELVSS is applied to a cathode terminal of the organic EL element L1. One conduction terminal (left terminal in FIG. 2) of the transistor Q2 is connected to the data line Sj, and the other conduction terminal of the transistor Q2 is connected to a gate terminal of the transistor Q1. One conduction terminal (left terminal in FIG. 2) of the transistor Q3 is connected to the data line Sj, and the other conduction terminal of the transistor Q3 is connected to the source terminal of the transistor Q1 and the anode terminal of the organic EL element L1. Gate terminals of the transistor Q2, Q3 are connected to the scanning lines GAi, GBi, respectively. The capacitor C1 is provided between the gate terminal and the drain terminal of the transistor Q1. The transistors Q1 to Q3 function as a drive transistor, a write control transistor, and a read control transistor, respectively.

Figure 3:
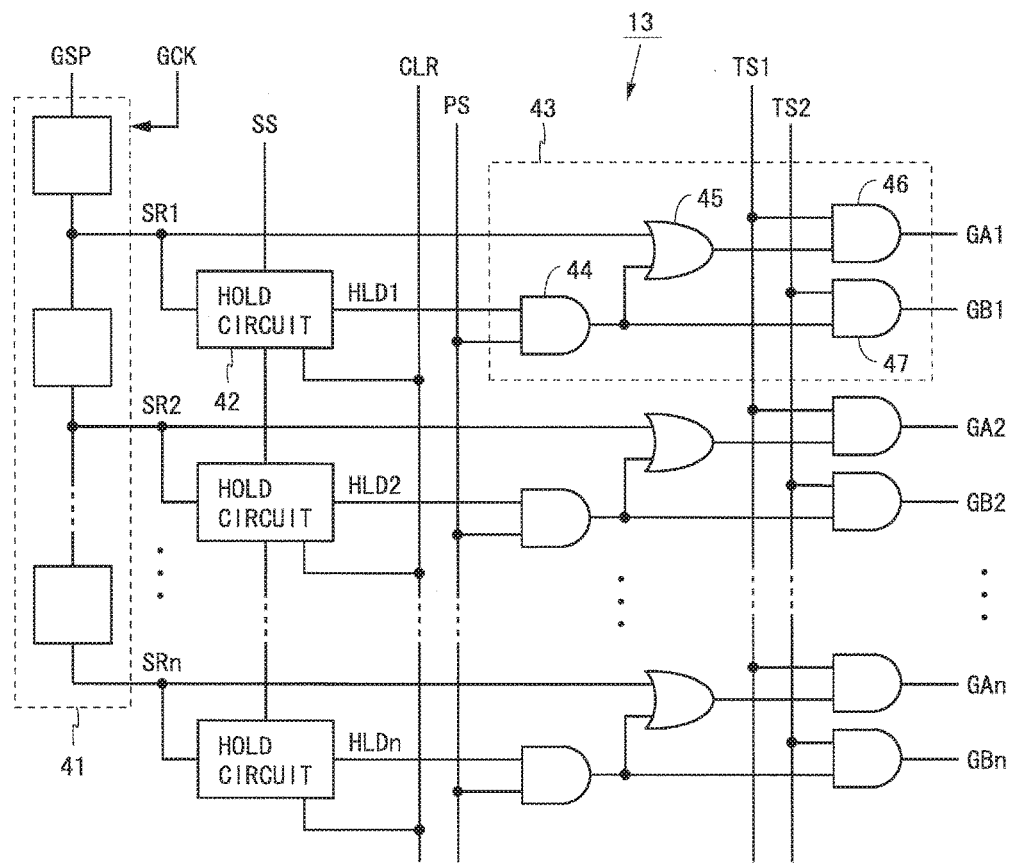
FIG. 3 is a circuit diagram of a scanning line drive circuit in the display device shown in FIG. 1.

FIG. 3 is a circuit diagram of the scanning line drive circuit 13. As shown in FIG. 3, the scanning line drive circuit 13 includes a shift register 41 having n stages, n hold circuits 42, and n scanning signal output circuits 43. The control signal CS1 supplied to the scanning line drive circuit 13 includes a gate start pulse GSP, a gate clock GCK, a sampling signal SS, a clear signal CLR, a period specifying signal PS, and timing signals TS1, TS2. An i-th stage of the shift register 41, an i-th hold circuit 42, and an i-th scanning signal output circuit 43 correspond to the scanning lines GAi, GBi. Hereinafter, an output of the i-th stage of the shift register 41 is referred to as a shift register output SRi, and an output of the i-th hold circuit 42 is referred to as a hold output HLDi.

The gate start pulse GSP is supplied to a first stage of the shift register 41. The gate clock GCK is supplied to each stage of the shift register 41. The gate start pulse GSP is in the high level for a predetermined time before the start of the video signal period. The period of the gate clock GCK is equal to the length of one line period. The shift register 41 shifts the gate start pulse GSP in accordance with the gate clock GCK. Therefore, the shift register outputs SR1 to SRn are in the high level for one line period sequentially in the order of SR1, SR2, . . . , SRn in the video signal period. In the i-th line period, the shift register output SRi is in the high level, and the other shift register outputs are in the low level.

The shift register output SRi, the sampling signal SS, and the clear signal CLR are input to the i-th hold circuit 42. The i-th hold circuit 42 holds the shift register output SRi according to the sampling signal SS. The hold output HLDi is equal to the shift register output SRi when the sampling signal SS is in the high level, and is not changed when the sampling signal SS is in the low level. However, the hold output HLDi is changed to the low level when the clear signal CLR is changed to the high level.

The i-th scanning signal output circuit 43 includes three AND gates 44, 46, 47 and an OR gate 45. The AND gate 44 outputs a logical product of the hold output HLDi and the period specifying signal PS. The OR gate 45 outputs a logical sum of the shift register output SRi and an output of the AND gate 44. The AND gate 46 outputs a logical product of the timing signal TS1 and an output of the OR gate 45. The AND gate 47 outputs a logical product of the timing signal TS2 and the output of the AND gate 44. An output of the AND gate 46 is applied to the scanning line GAi, and an output of the AND gate 47 is applied to the scanning line GBi.

Figure 4:
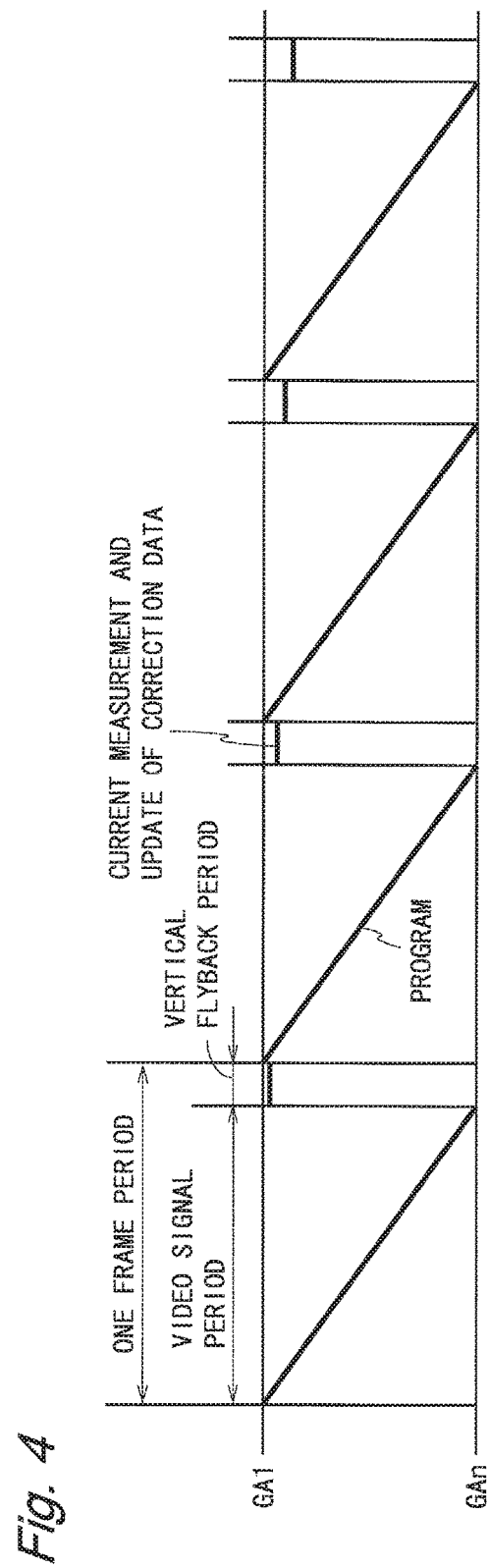
FIG. 4 is a timing chart showing an operation of the display device shown in FIG. 1.

FIG. 4 is a timing chart showing an operation of the display device 1. As shown in FIG. 4, one frame period is divided into the video signal period and the vertical flyback period. In the video signal period, the n scanning lines GA1 to GAn are sequentially selected, each for one line period. In the i-th line period, the scanning line GAi is selected, and data voltages are written to m pixel circuits 18 connected to the scanning line GAi (denoted by program in FIG. 4). In the vertical flyback period, one pair of the scanning lines GAi, GBi is selected, and currents that are output from the m pixel circuits 18 connected to the scanning line GAi to the data lines S1 to Sm are measured. The correction data stored in the correction data storage unit 16 is updated based on the current measurement results (denoted by current measurement and update of correction data in FIG. 4).

Figure 5:
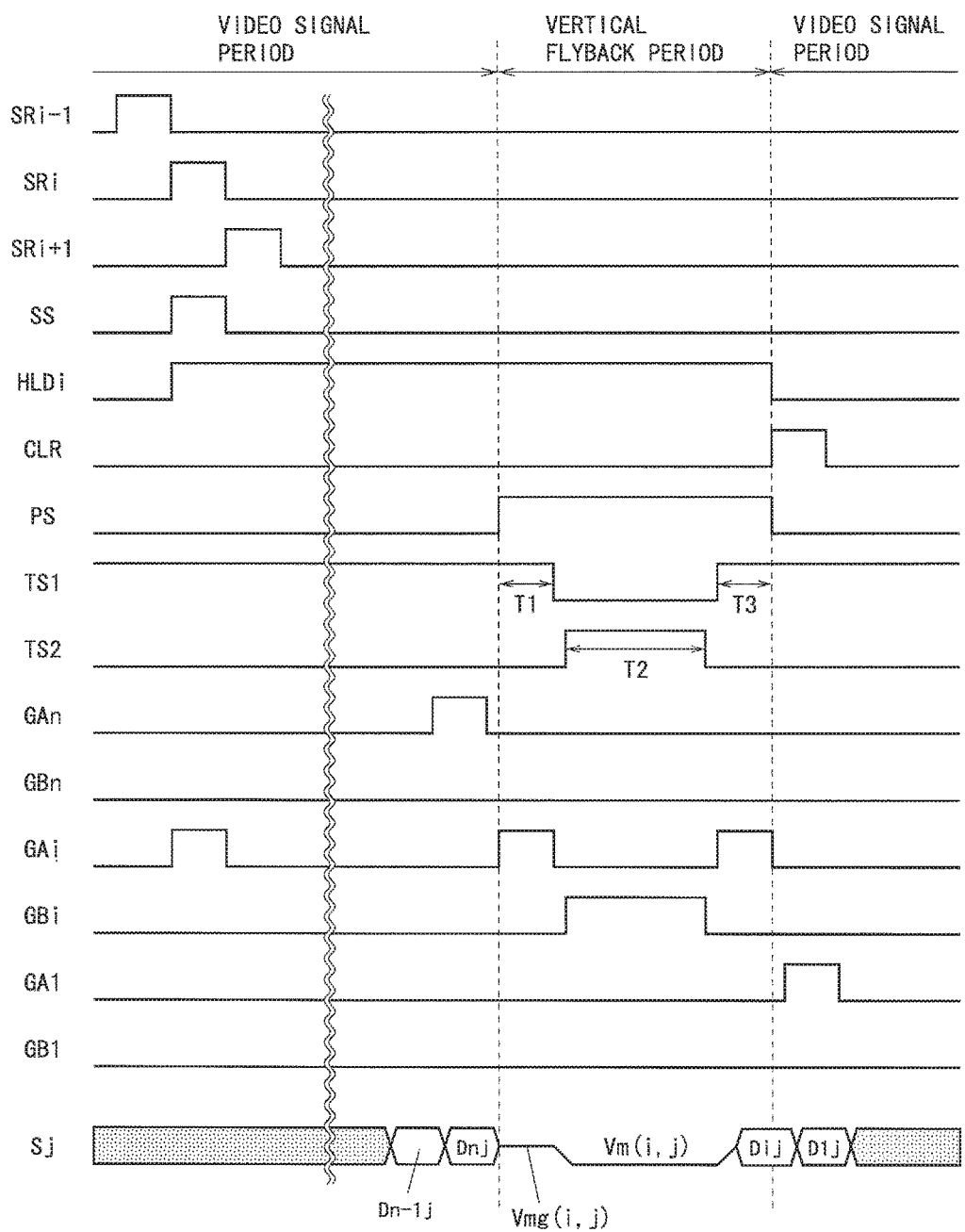
FIG. 5 is a detailed timing chart of the display device shown in FIG. 1.

FIG. 5 is a detailed timing chart of the display device 1. Hereinafter, there will be described that the scanning lines GA1 to GAn, GB1 to GBn can be driven according to the timing shown in FIG. 5, by using the scanning line drive circuit 13 shown in FIG. 3. There will be described herein a case in which the scanning lines GAi, GBi are selected in the vertical flyback period.

The signals included in the control signal CS1, except the sampling signal SS, are changed according to the same timing, taking one frame period as a period. The clear signal CLR is in the high level (active level) for a predetermine time after the end of the vertical flyback period, and is in the low level otherwise. The period specifying signal PS is in the low level during the video signal period, and is in the high level during the vertical flyback period. Note that since the vertical flyback period corresponds to a non-video signal period, it can be said that the clear signal CLR is changed to the active level after the end of the non-video signal period, and the period specifying signal PS indicates whether it is in the video signal period or in the non-video signal period. The timing signal TS1 is in the low level in a part of the vertical flyback period, and is in the high level otherwise. The timing signal TS2 is in the high level in a part of a period in which the timing signal TS1 is in the low level, and is in the low level otherwise. Hereinafter, a period in which the timing signal TS2 is in the high level is referred to as a period T2. In a period in which the timing signal TS1 is in the high level within the vertical flyback period, a period before the period T2 is referred to as a period T1, and a period after the period T2 is referred to as a period T3. When the scanning lines GAi, GBi are selected in a vertical flyback period, the sampling signal SS is in the high level (active level) in the i-th line period in a previous video signal period, and is in the low level otherwise. The display control circuit 12 switches the line period in which a high level sampling signal SS is output, every four frame periods.

During the video signal period, since the period specifying signal PS is in the low level, the outputs of the AND gates 44, 47 are in the low level. Therefore, the voltages of the scanning lines GB1 to GBn are in the low level during the video signal period. Further, during the video signal period, since the timing signal TS1 is in the high level, the output of the AND gate 46 is equal to the shift register output SRi. As described above, during the i-th line period, the shift register output SRi is in the high level, and the other shift register outputs are in the low level. Therefore, during the i-th line period, the voltage of the scanning line GAi is in the high level, and the voltages of the scanning lines GA1 to GAn (except GAi) are in the low level.

Since the clear signal CLR is changed to the high level at the end of the vertical flyback period, the shift register outputs SR1 to SRn are in the low level at the start of the video signal period. When the sampling signal SS is changed to the high level in the i-th line period, the shift register output SRi is changed to the high level. The sampling signal SS is input to the i-th the hold circuit 42 when the shift register output SRi is in the high level. Thus, the hold output HLDi is in the high level during the i-th or later line periods. The sampling signal SS is input to other hold circuits 42 when the shift register output is in the low level. Thus, the hold outputs HLD1 to HLDn (except HLDi) remain at the low level. The hold output HLDi is changed to the low level when the clear signal CLR is changed to the high level next time.

During the vertical flyback period, the period specifying signal PS and the hold output HLDi are in the high level, and the shift register outputs SR1 to SRn and the hold outputs HLD1 to HLDn (except HLDi) are in the low level. In the scanning signal output circuits 43 except the i-th one, since the shift register output and the hold output are in the low level, the output of the AND gate 44 and the output of the OR gate 45 are in the low level. Thus, the outputs of the AND gates 46, 47 are in the low level irrespective of the levels of the timing signals TS1, TS2. Therefore, the voltages of the scanning lines GA1 to GAn, GB1 to GBn (except GAi, GBi) are in the low level in the vertical flyback period.

In the i-th scanning signal output circuit 43, since the hold output HLDi and the period specifying signal PS are in the high level, the output of the AND gate 44 and the output of the OR gate 45 are in the high level. Thus, the outputs of the AND gates 46, 47 are equal to the timing signals TS1, TS2, respectively. Therefore, in the vertical flyback period, the voltage of the scanning line GAi is in the high level during the periods T1, T3, and is in the low level otherwise, as with the voltage of the timing signal TS1. The voltage of the scanning line GBi is in the high level in the period T2, and is in the low level otherwise, as with the voltage of the timing signal TS2.

Next, there will be described an operation of the pixel circuit 18 in the i-th row and the j-th column when the scanning lines GAi, GBi and the data line Sj are driven according to the timing shown in FIG. 5. Hereinafter, characteristics of the transistor Q1 are referred to as "TFT characteristics", and characteristics of the organic EL element L1 are referred to as "OLED characteristics".

In the i-th line period, the voltage of the scanning line GAi is in the high level, and the voltage of the scanning line GBi is in the low level. Thus, the transistor Q2 is turned on, and the transistor Q3 is turned off. At this time, the data line drive/current measurement circuit 14 applies to the data line Sj a data voltage Dij in accordance with the video signal X2. Therefore, a gate voltage of the transistor Q1 is changed to Dij.

At the end of the i-th line period, the voltage of the scanning line GAi is changed to the low level. With this, the transistor Q2 is turned off. After this, the gate voltage of the transistor Q1 is kept at Dij by an action of the capacitor C1. When the data voltage Dij is more than or equal to a predetermined level, the transistor Q1 is turned on, and a current of which amount corresponds to a gate-source voltage of the transistor Q1 flows through the organic EL element L1. The organic EL element L1 emits light at luminance in accordance with the amount of the flowing current. Therefore, the organic EL element L1 emits light at luminance in accordance with the data voltage Dij.

Periods T1 to T3 are set in the vertical flyback period. During the period T1, the voltage of the scanning line GAi is in the high level, and the voltage of the scanning line GBi is in the low level. Thus, the transistor Q2 is turned on, and the transistor Q3 is turned off. At this time, the data line drive/current measurement circuit 14 applies a measurement voltage Vmg(i,j) to the data line Sj. Therefore, the gate voltage of the transistor Q1 is changed to Vmg(i,j). The measurement voltage Vmg(i,j) is either a TFT characteristics measurement voltage or an OLED characteristics measurement voltage.

During the period T2, the voltage of the scanning line GAi is in the low level, the voltage of the scanning line GBi is in the high level. Thus, the transistor Q2 is turned off, and the transistor Q3 is turned on. In a case in which the TFT characteristics measurement voltage has been applied in the period T1, the transistor Q1 is turned on, and a current flows from the electrode having the high level power supply voltage ELVDD to the data line Sj passing through the transistors Q1, Q3. When the OLED characteristics measurement voltage has been applied in the period T1, the transistor Q1 is turned off, and a current flows from the data line Sj to the electrode having the low level power supply voltage ELVSS passing through the transistor Q3 and the organic EL element L1. While the measurement voltage Vmg(i,j) is being applied, the voltage of the data line Sj is Vmg(i,j). The data line drive/current measurement circuit 14 measures the current flowing through the data line Sj in the period T2.

During the period T3, the voltage of the scanning line GAi is in the high level, the voltage of the scanning line GBi is in the low level. At this time, the data line drive/current measurement circuit 14 and the pixel circuit 18 operate in the same manner as the i-th line period. After the period T3, the organic EL element L1 emits light at luminance in accordance with the data voltage Dij.

Figure 6:
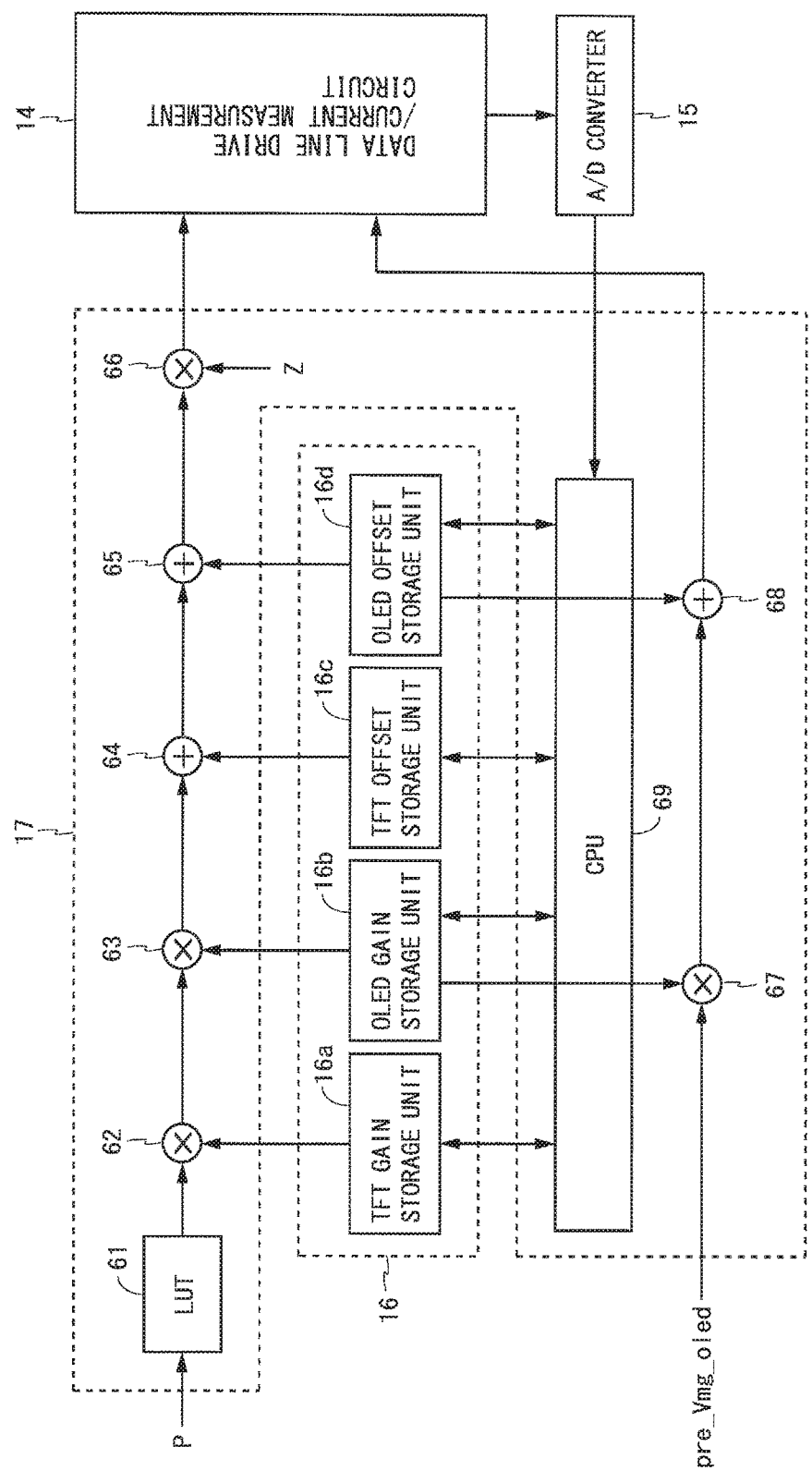
FIG. 6 is a block diagram showing details of a correction data storage unit and a correction calculation unit in the display device shown in FIG. 1.

FIG. 6 is a block diagram showing details of the correction data storage unit 16 and the correction calculation unit 17. As shown in FIG. 6, the correction data storage unit 16 includes a TFT gain storage unit 16a, an OLED gain storage unit 16b, a TFT offset storage unit 16c, and an OLED offset storage unit 16d. The four storage units 16a to 16d store (m×n) pieces of correction data corresponding to the (m×n) pixel circuit 18, respectively. The TFT gain storage unit 16a stores gains (hereinafter referred to TFT gain) based on detection results of the TFT characteristics. The OLED gain storage unit 16b stores gains (hereinafter referred to OLED gain) based on detection results of the OLED characteristics. The TFT offset storage unit 16c stores offsets (hereinafter referred to TFT offset) based on the detection results of the TFT characteristics. The OLED offset storage unit 16d stores offsets (hereinafter referred to OLED offset) based on the detection results of the OLED characteristics.

The correction calculation unit 17 includes a LUT 61, multipliers 62, 63, 66, 67, adders 64, 65, 68, and a CPU 69. A gradation P included in the video signal X1, a gradation P for detecting the TFT characteristics, a value pre_Vmg_oled for detecting the OLED characteristics, and an output of the A/D converter 15 are input to the correction calculation unit 17. Correction data with respect to the pixel circuit 18 in the i-th row and the j-th column is read out from the four storage units 16a to 16d.

The LUT 61 performs a gamma correction to the gradation P. The multiplier 62 multiplies an output of the LUT 61 by a TFT gain read out from the TFT gain storage unit 16a. The multiplier 63 multiplies an output of the multiplier 62 by an OLED gain read out from the OLED gain storage unit 16b. The adder 64 adds a TFT offset read out from the TFT offset storage unit 16c, to an output of the multiplier 63. The adder 65 adds an OLED offset read out from the OLED offset storage unit 16d, to an output of the adder 64. The multiplier 66 multiplies an output of the adder 65 by a coefficient Z for compensating for an attenuation of the data voltage. In the video signal period, the correction calculation unit 17 outputs to the data line drive/current measurement circuit 14 the video signal X2 including an output of the multiplier 66. In the vertical flyback period in which the TFT characteristics is to be detected, the correction calculation unit 17 outputs the output of the multiplier 66 to the data line drive/current measurement circuit 14, as data corresponding to the measurement voltage Vmg(i,j).

The multiplier 67 multiplies the value pre_Vmg_oled by the OLED gain read out from the OLED gain storage unit 16b. The adder 68 adds the OLED offset read out from the OLED offset storage unit 16d, to an output of the multiplier 67. In the vertical flyback period in which the OLED characteristics is to be detected, the correction calculation unit 17 outputs to the data line drive/current measurement circuit 14 an output of the adder 68 as data corresponding to the measurement voltage Vmg(i,j).

Figure 7:
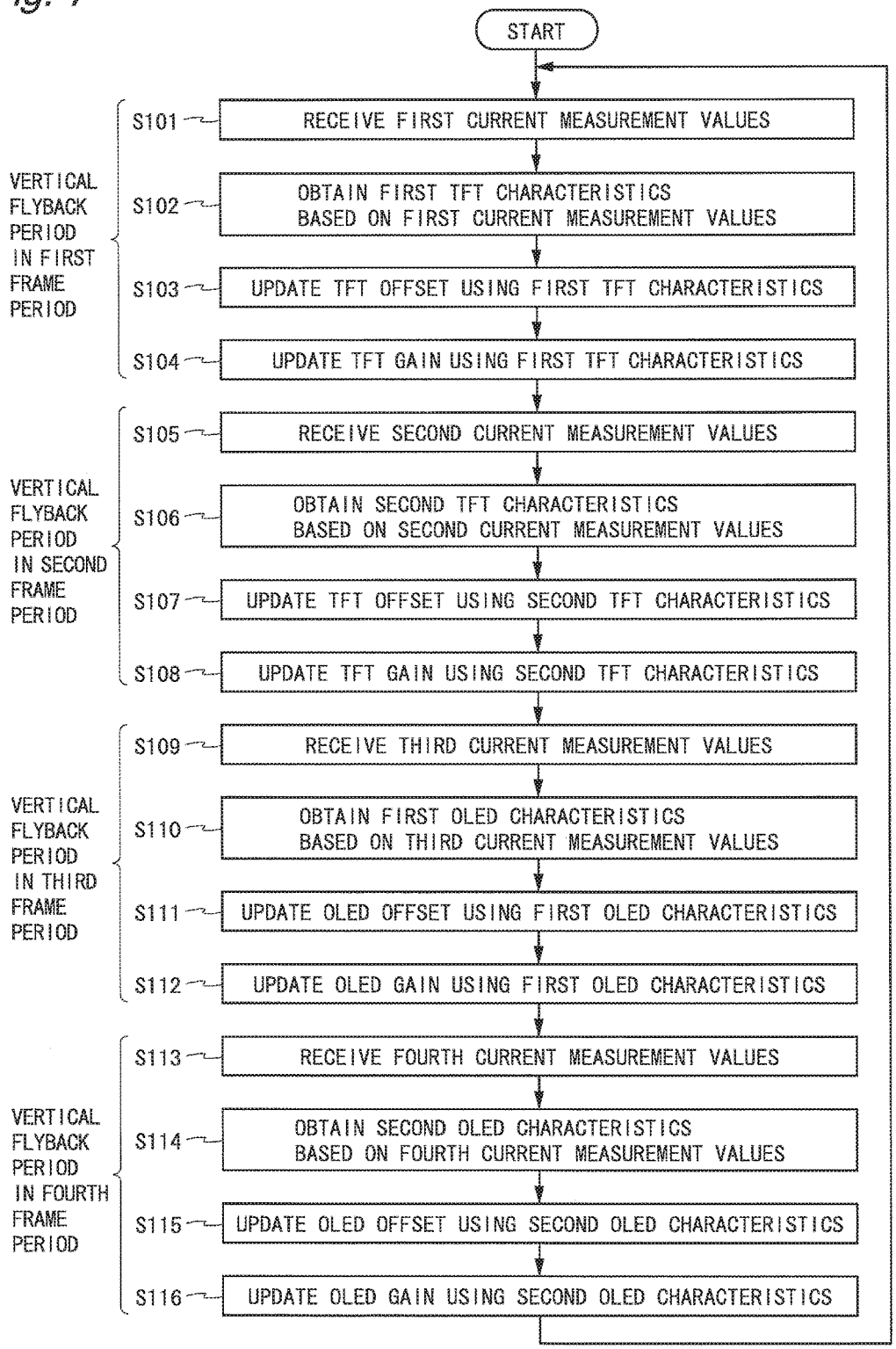
FIG. 7 is a flowchart showing an operation of a CPU in the display device shown in FIG. 1.
Figure 8A:
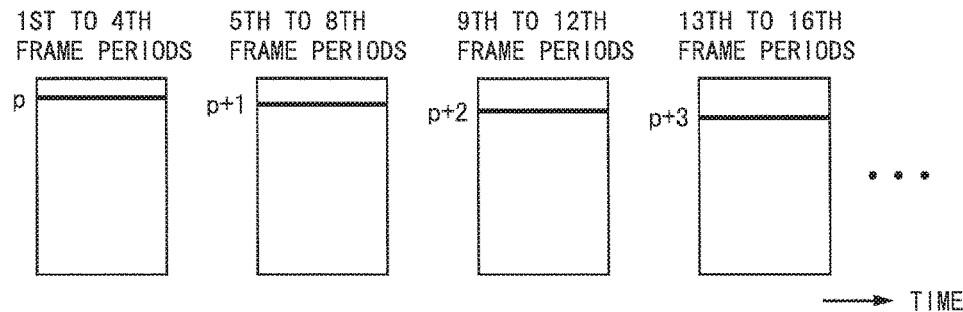
FIG. 8A is a diagram showing a selection method of a scanning line selected in a vertical flyback period in the display device shown in FIG. 1.
Figure 8B:
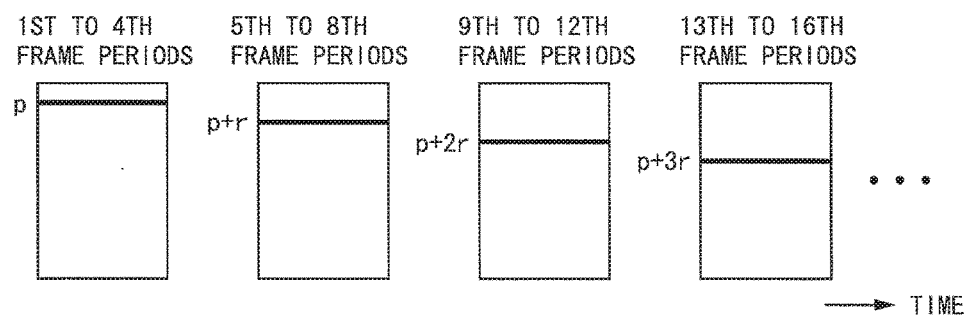
FIG. 8B is a diagram showing a selection method of the scanning line selected in the vertical flyback period in the display device shown in FIG. 1.
Figure 8C:
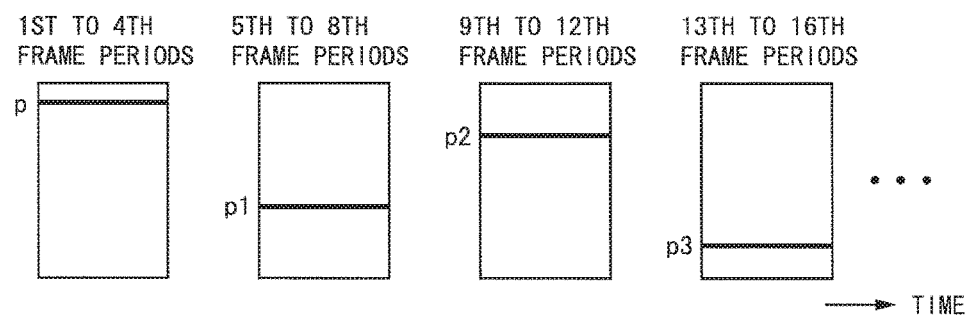
FIG. 8C is a diagram showing a selection method of the scanning line selected in the vertical flyback period in the display device shown in FIG. 1.
Figure 8D:
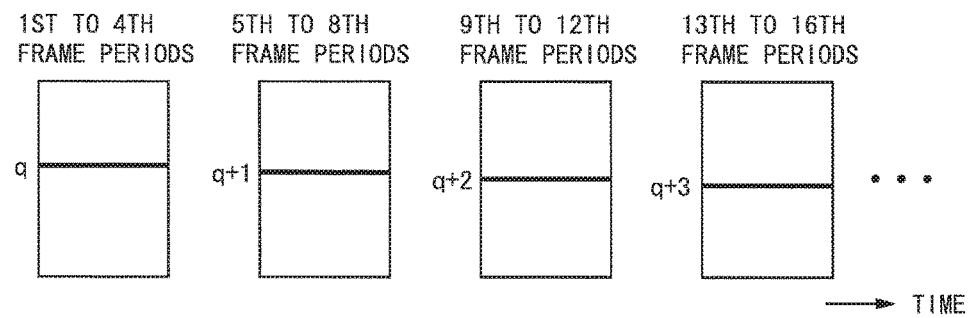
FIG. 8D is a diagram showing a selection method of the scanning line selected in the vertical flyback period in the display device shown in FIG. 1.

The CPU 69 updates correction data stored in the four storage units 16a to 16d, based on the output of the A/D converter 15. FIG. 7 is a flowchart showing an operation of the CPU 69. The CPU 69 performs steps S101 to S116 shown in FIG. 7 every four frame periods. The CPU 69 performs steps S101 to S104 in the vertical flyback period in a first frame period, performs steps S105 to S108 in the vertical flyback period in a second frame period, performs steps S109 to S112 in the vertical flyback period in a third frame period, and performs steps S113 to S116 in the vertical flyback period in a fourth frame period.

The data line drive/current measurement circuit 14 applies a first measurement voltage for measuring the TFT characteristics to the data lines S1 to Sm in the period T1 in the vertical flyback period in the first frame period, and measures currents that are output from the pixel circuits 18 to the data lines S1 to Sm in the period T2. The CPU 69 receives first current measurement values obtained at this time from the A/D converter 15 (step S101). Subsequently, the CPU 69 obtains the first TFT characteristics based on the first current measurement values received in step S101 (step S102). Subsequently, by using the first TFT characteristics, the CPU 69 updates the TFT offsets stored in the TFT offset storage unit 16c (step S103), and updates the TFT gains stored in the TFT gain storage unit 16a (step S104).

The data line drive/current measurement circuit 14 applies a second measurement voltage for measuring the TFT characteristics to the data lines S1 to Sm in the period T1 in the vertical flyback period in the second frame period, and measures currents that are output from the pixel circuits 18 to the data lines S1 to Sm in the period T2. The CPU 69 receives second current measurement values obtained at this time from the A/D converter 15 (step S105). Subsequently, the CPU 69 obtains the second TFT characteristics based on the second current measurement values received in step S105 (step S106). Subsequently, by using the second TFT characteristics, the CPU 69 updates the TFT offsets stored in the TFT offset storage unit 16c (step S107), and updates the TFT gains stored in the TFT gain storage unit 16a (step S108). Note that the first measurement voltage and the second measurement voltage are different from each other. For example, the first measurement voltage is a data voltage corresponding to a relatively low gradation, and the second measurement voltage is a data voltage corresponding to a relatively high gradation.

The data line drive/current measurement circuit 14 applies a third measurement voltage for measuring the OLED characteristics to the data lines S1 to Sm in the period T1 in the vertical flyback period in the third frame period, and measures currents that are output from the pixel circuits 18 to the data lines S1 to Sm in the period T2. The CPU 69 receives third current measurement values obtained at this time from the A/D converter 15 (step S109). Subsequently, the CPU 69 obtains the first OLED characteristics based on the third current measurement values received in step S109

(step S110). Subsequently, by using the first OLED characteristics, the CPU 69 updates the OLED offsets stored in the OLED offset storage unit 16d (step S111), and updates the OLED gains stored in the OLED gain storage unit 16b (step S112).

The data line drive/current measurement circuit 14 applies a fourth measurement voltage for measuring the OLED characteristics to the data lines S1 to Sm in the period T1 in the vertical flyback period in the fourth frame period, and measures currents that are output from the pixel circuits 18 to the data lines S1 to Sm in the period T2. The CPU 69 receives fourth current measurement values obtained at this time from the A/D converter 15 (step S113). Subsequently, the CPU 69 obtains the second OLED characteristics based on the fourth current measurement values received in step S113 (step S114). Subsequently, by using the second OLED characteristics, the CPU 69 updates the OLED offsets stored in the OLED offset storage unit 16d (step S115), and updates the OLED gains stored in the OLED gain storage unit 16b (step S116). Note that the third measurement voltage and the fourth measurement voltage are different from each other.

As described above, the display control circuit 12 switches the line period in which the high level sampling signal SS is output, every four frame periods. Therefore, the scanning line drive circuit 13 switches the scanning line selected in the vertical flyback period, every four frame periods. In the first to fourth frame periods, the data line drive/current measurement circuit 14 measures a current that is output from the pixel circuit 18 to which the first to fourth measurement voltages are written, respectively. In the first to fourth frame periods, the correction calculation unit 17 updates the correction data stored in the correction data storage unit 16, based on the first to fourth current measurement values, respectively. As thus described, by selecting the same scanning line successively in the vertical flyback periods, it is possible to measure a current with respect to the same pixel circuit 18 a plurality of times with changing conditions, and update the correction data based on a plurality of current measurement results.

FIGS. 8A to 8D are diagrams showing selection methods of the scanning line selected in the vertical flyback period. The display control circuit 12 switches the line period in which the high level sampling signal SS is output, by using the following first to fourth methods, for example. As a first method, the display control circuit 12 may switch the line period in which the high level sampling signal SS is output, every four frame periods sequentially (in an ascending order or a descending order). In this case, the scanning line selected in the vertical flyback period is sequentially switched every four frame periods (refer to FIG. 8A). With this, it is possible to measure a current with respect to the two-dimensionally arranged pixel circuits 18 sequentially on a row-by-row basis, and update the correction data based on the measurement results.

As a second method, the display control circuit 12 may switch the line period in which the high level sampling signal SS is output, every four frame periods sequentially with skipping a predetermined number of line periods. In this case, the scanning line selected in the vertical flyback period is switched every four frame periods sequentially with skipping the predetermined number of scanning lines (refer to FIG. 8B). By measuring a current sequentially with respect to the two-dimensionally arranged pixel circuits 18 with skipping a plurality of rows, it is possible to disperse effects of current measurement, and prevent degradation of an image quality of a display image.

As a third method, the display control circuit 12 may switch the line period in which the high level sampling signal SS is output, every four frame periods at random. In this case, the scanning line selected in the vertical flyback period is switched every four frame periods at random (refer to FIG. 8C). By switching a row of pixel circuits with respect to which the currents are measured, at random among the two-dimensionally arranged pixel circuits 18, it is possible to disperse effects of current measurement, and prevent the degradation of the image quality of the display image.

As a fourth method, the display control circuit 12 may switch the line period in which the high level sampling signal SS is output, every four frame periods with giving a priority to line periods in a specific range. In this case, the scanning line selected in the vertical flyback period is switched every four frame periods with giving a priority to scanning lines in a specific range (refer to FIG. 8D). A range which has large effects on the image quality of the display image (e.g., center of display screen) is selected as the specific range, for example. By measuring the current on a row-by-row basis with giving a priority to the pixel circuits in rows in a specific range among the two-dimensionally arranged pixel circuits 18, it is possible to measure the current preferentially with respect to the pixel circuits which has large effects on the image quality of the display image, and improve the image quality of the display image.

As described above, the display device 1 according to the present embodiment includes the display unit 11 including the 2n scanning lines GA1 to GAn, GB1 to GBn, the m data lines S1 to Sm, and the (m×n) pixel circuits 18 arranged two-dimensionally, the scanning line drive circuit 13, the data line drive circuit (data line drive/current measurement circuit 14), and the display control circuit 12 configured to output the period specifying signal PS indicating whether it is in the video signal period or in the non-video signal period (vertical flyback period) and the sampling signal SS which is in the high level (active level) in one line period in the video signal period. The scanning line drive circuit 13 includes the shift register 41 having n stages corresponding to the scanning lines, the n hold circuits 42 provided corresponding to the scanning lines, each configured to hold the shift register output SRi (output signal of corresponding stage of the shift register 41) in accordance the sampling signal SS, and the n scanning signal output circuits 43 provided corresponding to the scanning lines, each configured to output the scanning signal to be applied to a corresponding scanning line, based on the period specifying signal PS, the shift register output SRi, the hold output HLDi (output signal of corresponding hold circuit 42), and the timing signals TS1, TS2.

The scanning signal output circuit 43 is configured to output the scanning signal for voltage writing when the shift register output SRi is in the high level (selection level) in the video signal period, and output the scanning signal for current measurement and voltage writing when the hold output HLDi is in the high level in the vertical flyback period. The scanning signal output circuit 43 is configured to output the shift register output SRi as a first scanning signal to be applied to the scanning line GAi (first scanning line) and output the low level (non-selection level) signal as a second scanning signal to be applied to the scanning lines GBi (second scanning line) in the video signal period, and is configured to output as a first scanning signal the signal which is in the high level when the hold output HLDi and the timing signal TS1 (first timing signal) are in the high level (selection level), and output as a second scanning signal the signal which is in the high level when the hold output HLDi and the timing signal TS2 (second timing signal) are in the high level in the vertical flyback period. The timing signal TS1 is in the low level in a part of the vertical flyback period, and is in the selection level otherwise. The timing signal TS2 is in the high level in a part of a period in which the timing signal TS1 is in the low level, and is in the low level otherwise.

The pixel circuit 18 includes the organic EL element L1 (electro-optical element), the transistor Q1 (drive transistor) provided in series with the organic EL element L1, the transistor Q2 (write control transistor) provided between the data line Sj and the gate terminal (control terminal) of the transistor Q1, and having the gate terminal connected to the scanning line GAi, the transistor Q3 (read control transistor) provided between the data line Sj and the source terminal (one conduction terminal) of the transistor Q1, and having the gate terminal connected to the scanning lines GBi, and the capacitor C1 provided between the gate terminal and the drain terminal (other conduction terminal) of the transistor Q1. The data line drive circuit is configured to measure the current that is output from the pixel circuit 18 when the measurement voltage is written to the pixel circuit 18.

In the display device 1, since the n hold circuits 42 hold the shift register outputs SR1 to SRn respectively in a line period in the video signal period, one hold output HLDi is changed to the high level in the vertical flyback period in the non-video signal period. Further, in the vertical flyback period, since the scanning signal output circuit 43 outputs the scanning signal different from that in the video signal period, it is possible to select the scanning lines GA1 to GAn sequentially and apply the scanning signal for voltage writing to the selected scanning line in the video signal period, and select one pair of the scanning lines GAi, GBi, and apply the scanning signal for current measurement and voltage writing to the selected one pair of scanning lines in the vertical flyback period. Therefore, it is possible to select one pair of scanning lines corresponding to the pixel circuits in one row, and measure currents (currents that are output from pixel circuits when the measurement voltage is written) and write voltages with respect the pixel circuits in one row in the vertical flyback period.

Further, the scanning signal for current measurement and voltage writing to be applied to two kinds of the scanning lines GAi, GBi can be obtained by supplying two kinds of the timing signals TS1, TS2 to the scanning signal output circuit 43. Therefore, according to the display device 1 of the present embodiment, in a display device having pixel circuits including an electro-optical element, three transistors, and a capacitor, and two kinds of scanning lines, it is possible to select one pair of scanning lines corresponding to pixel circuits in one row, measure currents and write voltages with respect the pixel circuits in one row in the vertical flyback period, by using a simple circuit. Especially, when the scanning line drive circuit is formed on a glass substrate with the pixel circuits (referred to as gate driver monolithic configuration), it is possible to reduce an area of a frame formed in a surrounding of a pixel area. Further, since the display device 1 measures currents with respect to the pixel circuits in one row in the vertical flyback period, it is possible to reduce an amount of a line memory which is necessary for data transmission from the display control circuit 12 to the data line drive/current measurement circuit 14.

Further, the display control circuit 12 is configured to further output the clear signal CLR which is changed to the high level (active level) at the end of the vertical flyback period, and the hold outputs HLD1 to HLDn are changed to the low level in accordance with the clear signal CLR. Therefore, the hold outputs HLD1 to HLDn can be set to the low level at the end of the vertical flyback period by using the clear signal CLR. Further, the display device 1 further includes the correction calculation unit 17 configured to correct the video signal X1 based on the current measured by the data line drive/current measurement circuit 14. Therefore, it is possible to compensate for luminance drop of the pixels and improve the image quality of the display image, by correcting the video signal X1 based on the current measurement results.

Further, in the display device 1 having a gate monolithic configuration, it is preferable to form the hold circuit 42 included in the scanning line drive circuit 13 by using an oxide TFT having a small off-leakage current. With this, it is possible to hold the shift register output SRi stably for one frame period and measure the current stably. Further, when the hold circuit 42 is formed using the oxide TFT, it is preferable to also form the pixel circuit 18 using the oxide TFT. With this, it is possible to form the transistors in the hold circuit 42 and the transistors in the pixel circuit 18 simultaneously and shorten a manufacturing process.

As the oxide TFT, an indium gallium zinc oxide TFT having a channel layer formed of InGaZnOx (indium gallium zinc oxide) that is an oxide semiconductor of which main components are indium (In), gallium (Ga), zinc (Zn), and oxygen (O) can be used, for example. Alternatively, an oxide TFT of which channel layer is formed of an oxide semiconductor including at least one of indium, gallium, zinc, copper (Cu), silicon (Si), tin (Sn), aluminum (Al), calcium (Ca), germanium (Ge), and lead (Pb) may be used, for example. By using such an oxide TFT, similar effects as attained by the indium gallium zinc oxide TFT can be attained. The oxide TFT such as the indium gallium zinc oxide TFT is effective when it is adopted as an N-channel transistor in the pixel circuit. However, the present invention does not preclude using a P-channel oxide TFT.

An oxide semiconductor layer included in the oxide TFT will be described here. The oxide semiconductor layer is an In—Ga—Zn—O based semiconductor layer, for example. The oxide semiconductor layer includes an In—Ga—Zn—O based semiconductor, for example. The In—Ga—Zn—O based semiconductor is a ternary oxide of indium, gallium, and zinc. The ratio (composition ratio) of In, Ga and Zn is not particularly limited, and may be In:Ga:Zn=2:2:1, In:Ga:Zn=1:1:1, In:Ga:Zn=1:1:2, and the like, for example.

Since the TFT having the In—Ga—Zn—O based semiconductor layer has a high mobility (more than twenty times compared with an amorphous silicon TFT) and a low leakage current (less than one hundredth compared with the amorphous silicon TFT), it is preferably used as a transistor in the pixel circuit. It is possible to reduce a consumption power of the display device largely by using the TFT having the In—Ga—Zn—O based semiconductor layer.

The In—Ga—Zn—O based semiconductor may be amorphous, or may include a crystalline part and may have crystallinity. As a crystalline In—Ga—Zn—O based semiconductor, a crystalline In—Ga—Zn—O based semiconductor in which a c-axis is aligned to approximately perpendicular to a surface of a layer is preferable. Such a crystal structure of the In—Ga—Zn—O based semiconductor is disclosed in Japanese Laid-Open Patent Publication No. 2012-134475, for example.

The oxide semiconductor layer may include other oxide semiconductor in place of the In—Ga—Zn—O based semiconductor. For example, it may include a Zn—O based semiconductor (ZnO), an In—Zn—O based semiconductor (IZO (registered trade mark)), a Zn—Ti—O based semiconductor (ZTO), a Cd—Ge—O based semiconductor, a Cd—Pb—O based semiconductor, a CdO (cadmium oxide), an Mg—Zn—O based semiconductor, an In—Sn—Zn—O based semiconductor (e.g., $In_2O_3$—$SnO_2$—ZnO), an In—Ga—Sn—O based semiconductor, and the like.

Figure 9:
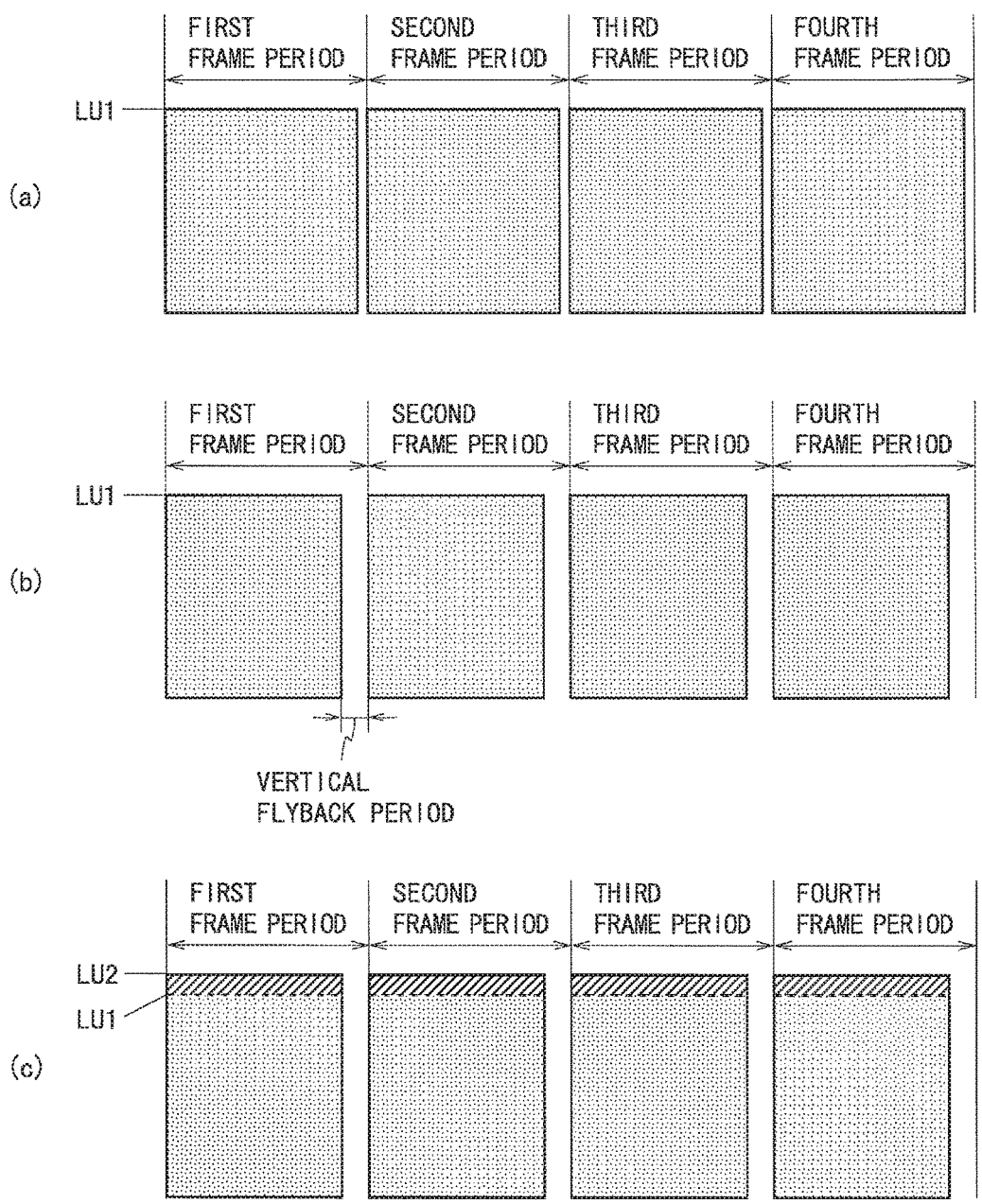
FIG. 9 is a diagram for explaining a correction processing in a display device according to a first variant of the first embodiment.

Note that following variants can be configured based on the display device 1 according to the present embodiment. FIG. 9 is a diagram for explaining a correction processing in a display device according to a first variant. FIG. 9(a) describes luminance of the organic EL element L1 in the pixel circuit 18 which is not selected in the vertical flyback period. In this case, the organic EL element L1 is controlled to be in a non-light emitting state in a part of the vertical flyback period. FIG. 9(b) describes luminance of the organic EL element L1 in the pixel circuit 18 selected in the vertical flyback period in the display device 1. In this case, the organic EL element L1 is controlled to be in the non-light emitting state in an entire vertical flyback period for four frame periods. Therefore, an average luminance of the organic EL element L1 in the pixel circuit 18 selected in the vertical flyback period is lower for four frame periods than an average luminance of the organic EL element L1 in the pixel circuit 18 which is not selected in the vertical flyback period, even when the two organic EL elements L1 emit light at the same luminance (LU1 in FIG. 9).

In the display device according to the first variant, when writing a data voltage to the pixel circuit 18 selected in the vertical flyback period, the data line drive/current measurement circuit applies to each of the data lines S1 to Sm a corrected voltage according to luminance drop of the pixel circuit 18. With this, luminance when the organic EL element L1 emits light in the pixel circuit 18 selected in the vertical flyback period increases from LU1 to LU2, and the average luminance of the organic EL element L1 in the pixel circuit 18 selected in the vertical flyback period becomes equal to the average luminance of the organic EL element L1 in the pixel circuit 18 which is not selected in the vertical flyback period. Therefore, according to the display device of the first variant, by writing a corrected voltage to the pixel circuit with respect to which the current is measured, it is possible to prevent luminance drop at the pixel circuit with respect to which the current is measured, and prevent degradation of the image quality of the display image.

Figure 10:
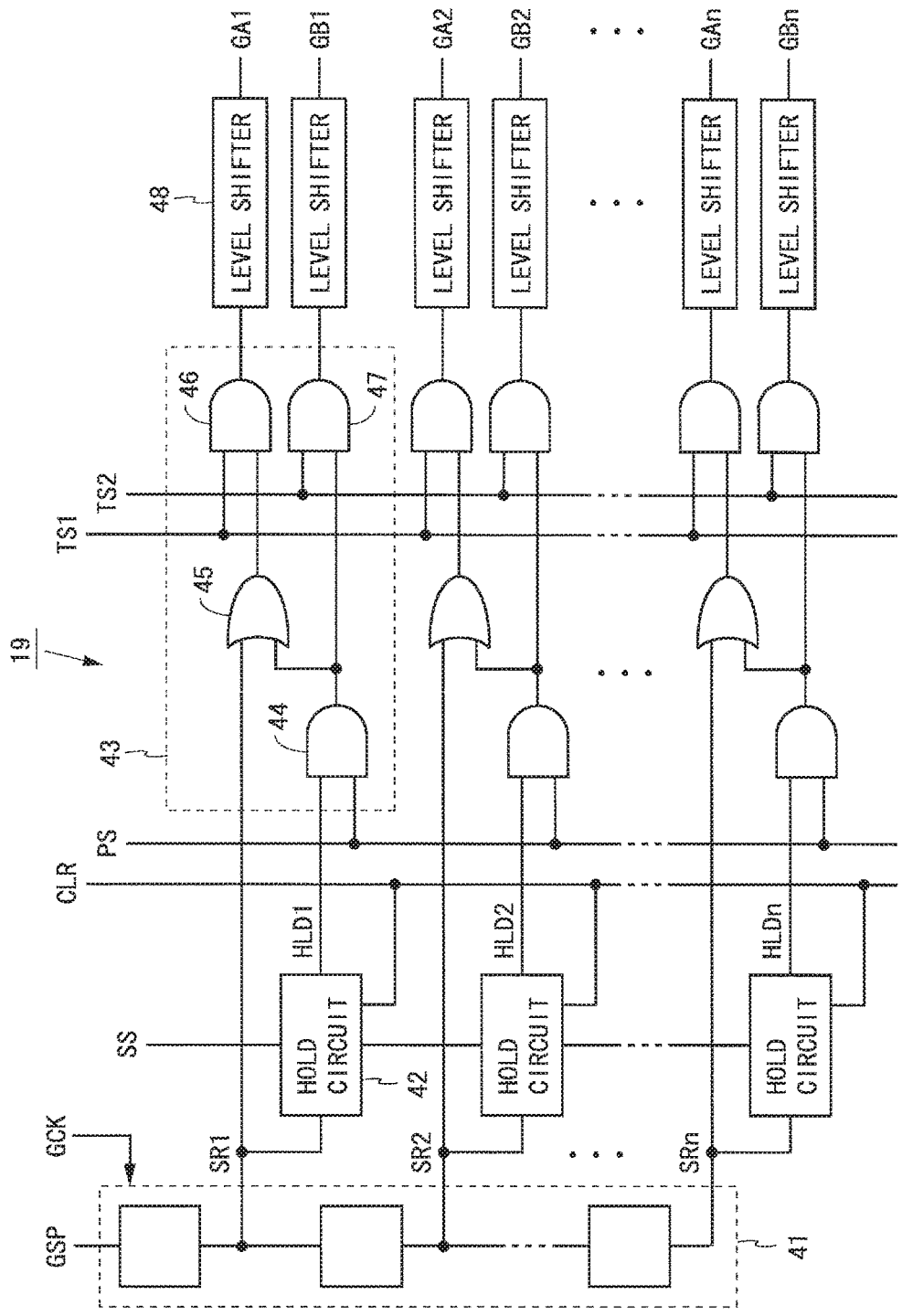
FIG. 10 is a circuit diagram of a scanning line drive circuit in a display device according to a second variant of the first embodiment.

FIG. 10 is a circuit diagram of a scanning line drive circuit in a display device according to a second variant. A scanning line drive circuit 19 shown in FIG. 10 is obtained by adding 2n level shifters 48 to the scanning line drive circuit 13. Two level shifters 48 are provided corresponding to the scanning lines GAi, GBi. One level shifter 48 has an input connected to the output of the AND gate 46, and an output connected to the scanning line GAi. The other level shifter 48 has an input connected to the output of the AND gate 47, and an output connected to the scanning line GBi. According to the display device of the second variant, by providing the level shifters 48 at output stages of the scanning line drive circuit 19, it is possible to convert levels of the output signals of the scanning signal output circuit 43 to levels which are necessary for driving the scanning lines GA1 to GAn, GB1 to GBn.

In a display device according to a third variant, the display control circuit does not output to the scanning line drive circuit the clear signal CLR which is changed to the high level at the end of the vertical flyback period, but instead changes the sampling signal SS to the high level at the end of the vertical flyback period. According to the display device of the third variant, it is possible to set the output of the hold circuit 42 to the low level at the end of the vertical flyback period, as with a case in which the clear signal CLR is used.

Second Embodiment

Figure 11:
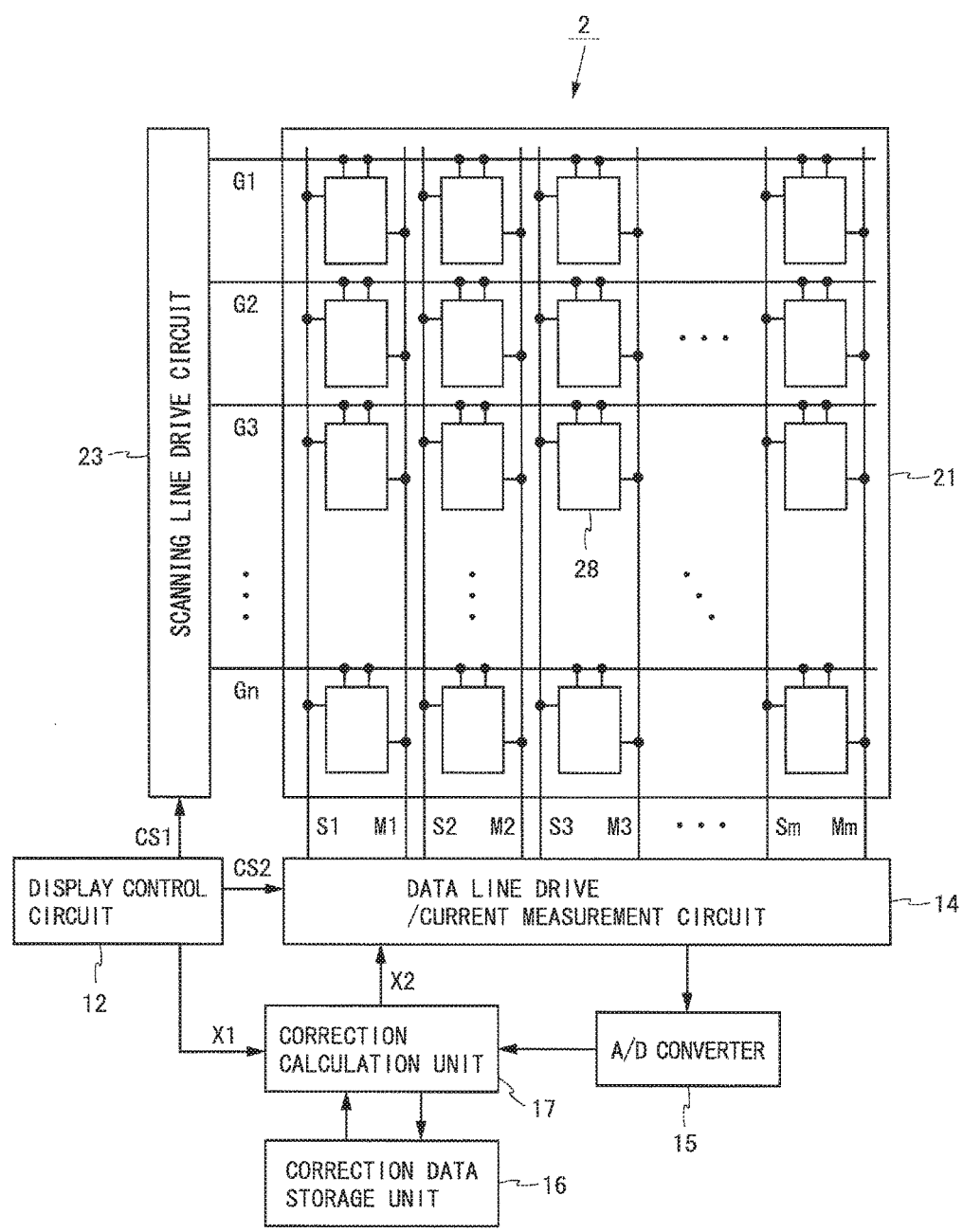
FIG. 11 is a block diagram showing a configuration of a display device according to a second embodiment of the present invention.

FIG. 11 is a block diagram showing a configuration of a display device according to a second embodiment of the present invention. A display device 2 shown in FIG. 11 is obtained by replacing the display unit 11 and the scanning line drive circuit 13 in the display device 1 according to the first embodiment with a display unit 21 and a scanning line drive circuit 23, respectively. Of the components of the present embodiment, the same component as that of the first embodiment is provided with the same reference numeral and description thereof is omitted.

The display unit 21 includes n scanning lines G1 to Gn, the m data lines S1 to Sm, m monitor lines M1 to Mm, and (m×n) pixel circuits 28. The scanning lines G1 to Gn are arranged in parallel to each other. The data lines S1 to Sm and the monitor lines M1 to Mm are arranged in parallel to each other so as to intersect with the scanning lines G1 to Gn perpendicularly. The (m×n) pixel circuits 28 are arranged two-dimensionally corresponding to the intersections of the scanning lines G1 to Gn and the data lines S1 to Sm.

Figure 12:
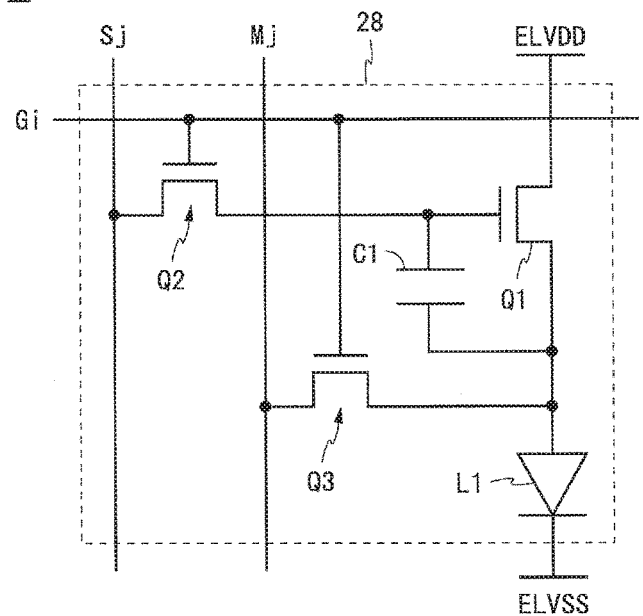
FIG. 12 is a circuit diagram of a pixel circuit in the display device shown in FIG. 11.

FIG. 12 is a circuit diagram of the pixel circuit 28 in an i-th row and a j-th column. As shown in FIG. 12, the pixel circuit 28 includes the organic EL element L1, the transistors Q1 to Q3, and the capacitor C1, and is connected to a scanning line Gi, the data line Sj, and a monitor line Mj. The configuration of the pixel circuit 28 is the same as that of the pixel circuit 18, except following points. One conduction terminal (left terminal in FIG. 12) of the transistor Q3 is connected to the monitor line Mj. The gate terminals of the transistors Q2, Q3 are connected to the scanning line Gi. The capacitor C1 is provided between the gate terminal and the source terminal of the transistor Q1.

Figure 13:
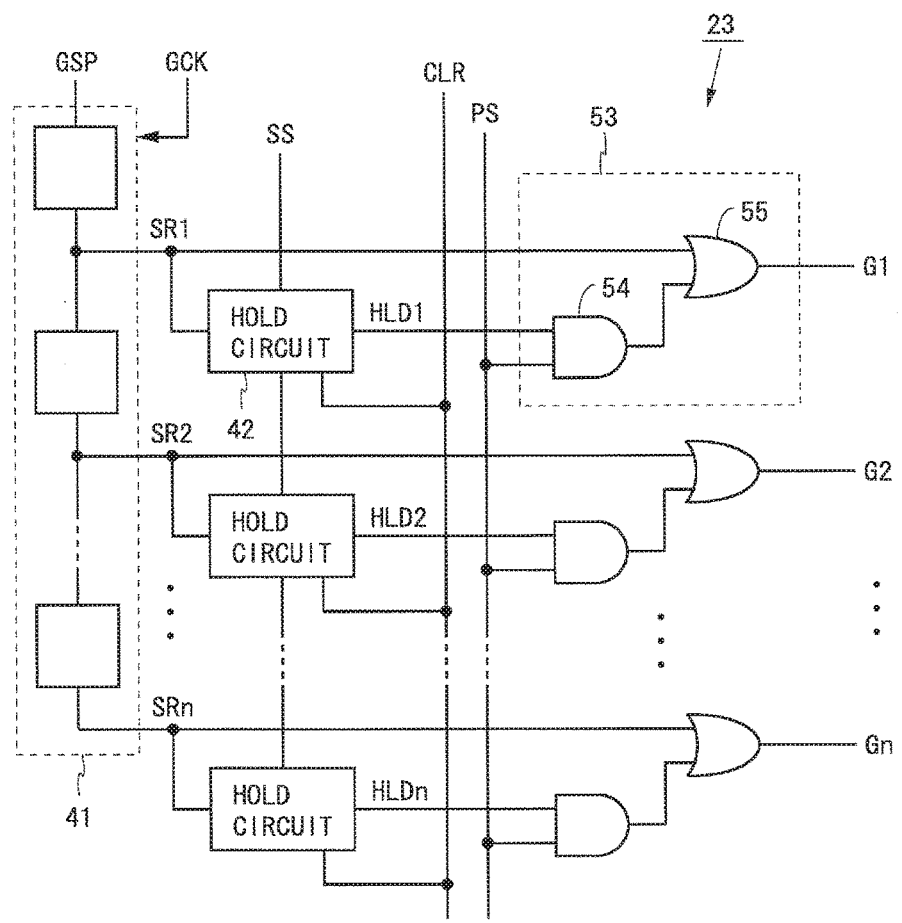
FIG. 13 is a circuit diagram of a scanning line drive circuit in the display device shown in FIG. 11.

FIG. 13 is a circuit diagram of the scanning line drive circuit 23. As shown in FIG. 13, the scanning line drive circuit 23 includes the shift register 41 having n stages, the n hold circuits 42, and n scanning signal output circuits 53. The control signal CS1 supplied to the scanning line drive circuit 23 includes the gate start pulse GSP, the gate clock GCK, the sampling signal SS, the clear signal CLR, and the period specifying signal PS.

The shift register 41 and the n hold circuits 42 operate in a manner similar to the first embodiment. An i-th scanning signal output circuit 53 includes an AND gate 54 and an OR gate 55. The AND gate 54 outputs a logical product of the hold output HLDi and the period specifying signal PS. The OR gate 55 outputs a logical sum of the shift register output SRi and an output of the AND gate 54. An output of the OR gate 55 is applied to the scanning line Gi.

Figure 14:
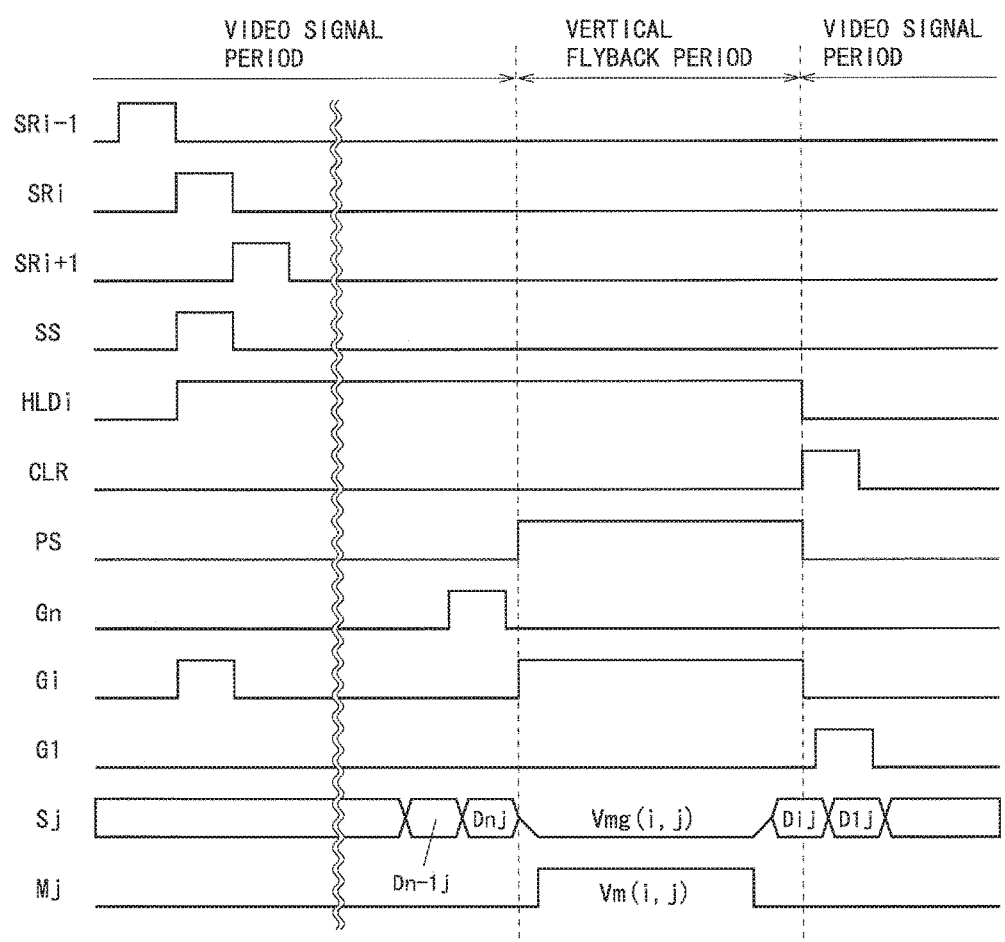
FIG. 14 is a detailed timing chart of the display device shown in FIG. 11.

As with the display device 1, the display device 2 operates according to the timing chart shown in FIG. 4. FIG. 14 is a detailed timing chart of the display device 2. Hereinafter, there will be described that the scanning lines G1 to Gn can be driven according to the timing shown in FIG. 14, by using the scanning line drive circuit 23 shown in FIG. 13. There will be described herein a case in which the scanning line Gi is selected in the vertical flyback period. The sampling signal SS, the clear signal CLR, and the period specifying signal PS are changed in a manner similar to the first embodiment.

During the video signal period, since the period specifying signal PS is in the low level, the output of the AND gate 54 is in the low level, and the output of the OR gate 55 is equal to the shift register output SRi. Therefore, during the i-th line period, a voltage of the scanning line Gi is in the high level, and voltages of the scanning lines G1 to Gn (except Gi) are in the low level.

The shift register outputs SR1 to SRn are in the low level at the start of the video signal period. When the sampling signal SS is changed to the high level in the i-th line period, the hold output HLDi is changed to the high level. The hold outputs HLD1 to HLDn (except HLDi) remain at the low level.

During the vertical flyback period, the period specifying signal PS and the hold output HLDi are in the high level, and the shift register outputs SR1 to SRn and the hold outputs HLD1 to HLDn (except HLDi) are in the low level. In the scanning signal output circuits 53 except an i-th one, since the shift register output and the hold output are in the low level, the output of the AND gate 54 and the output of the OR gate 55 are in the low level. Therefore, during the vertical flyback period, the voltages of the scanning lines G1 to Gn (except Gi) are in the low level. In the i-th scanning signal output circuit 53, since the hold output HLDi and the period specifying signal PS are in the high level, the output of the AND gate 54 and the output of the OR gate 55 are in the high level. Therefore, the voltage of the scanning line Gi is in the high level in the vertical flyback period.

Next, there will be described an operation of the pixel circuit 28 in the i-th row and the j-th column when the scanning line Gi and the data line Sj are driven according to the timing shown in FIG. 14. In the i-th line period, since the voltage of the scanning line Gi is in the high level, the transistors Q2, Q3 are turned on. At this time, the data line drive/current measurement circuit 14 applies the data voltage Dij to the data line Sj. Therefore, the gate voltage of the transistor Q1 is changed to Dij.

At the end of the i-th line period, the voltage of the scanning line Gi is changed to the low level. With this, the transistors Q2, Q3 are turned off. After this, the gate voltage of the transistor Q1 is kept at Dij by an action of the capacitor C1. When the data voltage Dij is more than or equal to a predetermined level, the transistor Q1 is turned on, and a current of which amount corresponds to the gate-source voltage of the transistor Q1 flows through the organic EL element L1. The organic EL element L1 emits light at luminance in accordance with the amount of the flowing current.

In the vertical flyback period, the voltage of the scanning line Gi is changed to the high level. With this, the transistors Q2, Q3 are turned on. In the vertical flyback period except an ending part thereof, the data line drive/current measurement circuit 14 applies the measurement voltage Vmg(i,j) to the data line Sj. Therefore, the gate voltage of the transistor Q1 is changed to Vmg(i,j). The measurement voltage Vmg(i,j) is either a TFT characteristics measurement voltage or an OLED characteristics measurement voltage. When the TFT characteristics measurement voltage is applied, the transistor Q1 is turned on, and a current flows from an electrode having the high level power supply voltage ELVDD to the monitor line Mj passing through the transistors Q1, Q3. When the OLED characteristics measurement voltage is applied, the transistor Q1 is turned off, and a current flows from the monitor line Mj to an electrode having the low level power supply voltage ELVSS passing through the transistor Q3 and the organic EL element L1. While the measurement voltage Vmg(i,j) is being applied to the data line Sj, the voltage of the monitor line Mj is Vmg(i,j). The data line drive/current measurement circuit 14 measures a current flowing through the monitor line Mj in the vertical flyback period except the ending part thereof.

In the ending part of the vertical flyback period, the data line drive/current measurement circuit 14 applies the data voltage Dij to the data line Sj. At this time, the pixel circuit 28 operates in a manner similar to the i-th line period. At the end of the vertical flyback period, the clear signal CLR is changed to the high level, and the period specifying signal PS is changed to the low level. With this, the voltage of the scanning line Gi is changed to the low level. After this, the organic EL element L1 emits light at luminance in accordance with the data voltage Dij.

Details of the correction data storage unit 16 and the correction calculation unit 17 in the display device 2 are the same as those in the first embodiment (refer to FIG. 6). An operation of the CPU 69 included in the correction calculation unit 17 is the same as that in the first embodiment (refer to FIG. 7).

As described above, the display device 2 according to the present embodiment includes the display unit 21 including the n scanning lines G1 to Gn, the m data lines S1 to Sm, the m monitor lines M1 to Mm, and the (m×n) pixel circuits 28 arranged two-dimensionally, the scanning line drive circuit 23, the data line drive circuit (data line drive/current measurement circuit 14), and the display control circuit 12 configured to output the period specifying signal PS indicating whether it is in the video signal period or in the non-video signal period (vertical flyback period) and the sampling signal SS which is in the high level in one line period in the video signal period. The scanning line drive circuit 23 includes the shift register 41 having n stages corresponding to the scanning lines, the n hold circuits 42 provided corresponding to the scanning lines, each configured to hold the shift register output SRi in accordance with the sampling signal SS, and the n scanning signal output circuits 53 provided corresponding to the scanning lines, each configured to output the scanning signal to be applied to a corresponding scanning line based on the period specifying signal PS, the shift register output SRi, and the hold output HLDi. The scanning signal output circuit 53 is configured to output the shift register output SRi as the scanning signal in the video signal period, and output the hold output HLDi as the scanning signal in the vertical flyback period.

The pixel circuit 28 includes the organic EL element L1 (electro-optical element), the transistor Q1 (drive transistor) provided in series with the organic EL element L1, the transistor Q2 (write control transistor) provided between the data line Sj and the gate terminal (control terminal) of the transistor Q1, and having the gate terminal connected to the scanning line Gi, the transistor Q3 (read control transistor) provided between the monitor line Mj and the source terminal (one conduction terminal) of the transistor Q1, and having the gate terminal connected to the scanning line Gi, and the capacitor C1 provided between the gate terminal and the source terminal of the transistor Q1.

According to the display device 2 of the present embodiment, in a display device having pixel circuits, each including an electro-optical element, three transistors, and a capacitor, and monitor lines, it is possible to select one scanning line corresponding to the pixel circuits in one row, and measure currents and write voltages with respect to the pixel circuits in one row in the vertical flyback period, by using a simple circuit. First to third variants can be configured for the display device 2 according to the present embodiment, as with the first embodiment.

Third Embodiment

Figure 15:
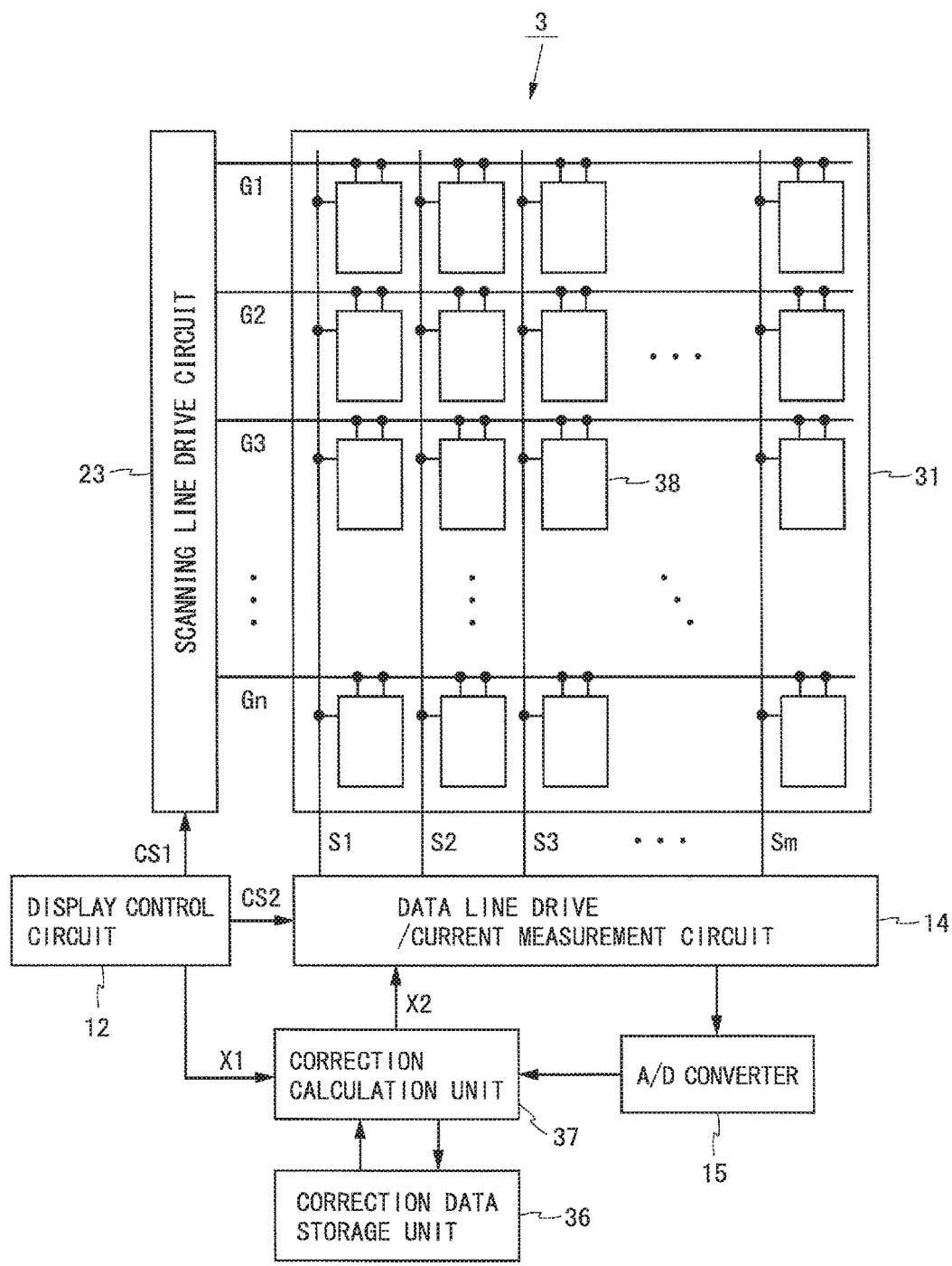
FIG. 15 is a block diagram showing a configuration of a display device according to a third embodiment of the present invention.

FIG. 15 is a block diagram showing a configuration of a display device according to a third embodiment of the present invention. A display device 3 shown in FIG. 15 is obtained by replacing the display unit 11, the scanning line drive circuit 13, the correction data storage unit 16, and the correction calculation unit 17 in the display device 1 according to the first embodiment with a display unit 31, the scanning line drive circuit 23, a correction data storage unit 36, and a correction calculation unit 37, respectively. Of the components of the present embodiment, the same component as that of the first or second embodiment is provided with the same reference numeral and description thereof is omitted.

The display unit 31 includes the n scanning lines G1 to Gn, the m data lines S1 to Sm, and (m×n) pixel circuits 38. The scanning lines G1 to Gn are arranged in parallel to each other. The data lines S1 to Sm are arranged in parallel to each other so as to intersect with the scanning lines G1 to Gn perpendicularly. The (m×n) pixel circuits 38 are arranged two-dimensionally corresponding to intersections of the scanning lines G1 to Gn and the data lines S1 to Sm. A reference voltage Vref is supplied to the pixel circuit 38 using a wiring not shown, in addition to the high level power supply voltage ELVDD and the low level power supply voltage ELVSS.

Figure 16:
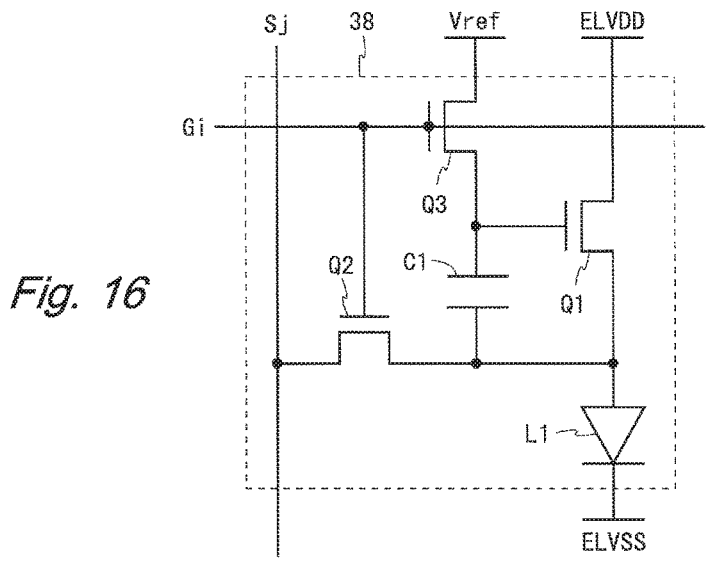
FIG. 16 is a circuit diagram of a pixel circuit in the display device shown in FIG. 15.

FIG. 16 is a circuit diagram of the pixel circuit 38 in an i-th row and a j-th column. As shown in FIG. 16, the pixel circuit 38 includes the organic EL element L1, the transistors Q1 to Q3, and the capacitor C1, and is connected to the scanning line Gi and the data line Sj. The transistor Q1 and the organic EL element L1 are connected in the same manner as those in the pixel circuit 18. One conduction terminal (left terminal in FIG. 16) of the transistor Q2 is connected to the data line Sj, and the other conduction terminal of the transistor Q2 is connected to the source terminal of the transistor Q1 and the anode terminal of the organic EL element L1. The drain terminal of the transistor Q3 is connected to the wiring having the reference voltage Vref, and the source terminal of the transistor Q3 is connected to the gate terminal of the transistor Q1. The gate terminals of the transistors Q2, Q3 are connected to the scanning line Gi. The capacitor C1 is provided between the gate terminal and the source terminal of the transistor Q1. The transistors Q1 to Q3 function as a drive transistor, a write control transistor, and a reference voltage applying transistor, respectively.

Figure 17:
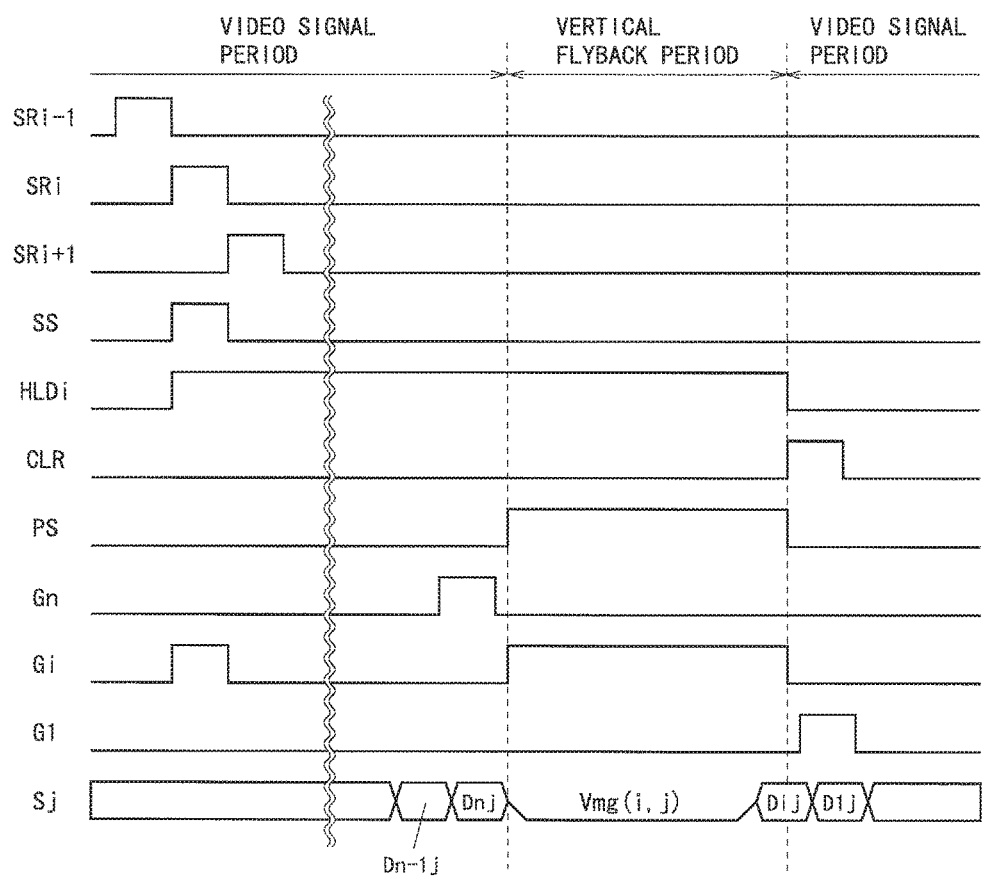
FIG. 17 is a detailed timing chart of the display device shown in FIG. 15.

As with the display device 1, the display device 3 operates according to the timing chart shown in FIG. 4. FIG. 17 is a detailed timing chart of the display device 3. The timing chart shown in FIG. 17 is obtained by removing a change of the voltage of the monitor line Mj from the timing chart shown in FIG. 14. In the present embodiment, as with the second embodiment, the scanning lines G1 to Gn can be driven in accordance with the timing shown in FIG. 17, by using the scanning line drive circuit 23 shown in FIG. 13. In the present embodiment, the display control circuit 12 switches the line period in which a high level sampling signal SS is output, every two frame periods.

Hereinafter, there will be described an operation of the pixel circuit 38 in the i-th row and the j-th column when the scanning line Gi and the data line Sj are driven in accordance with the timing shown in FIG. 17. During the i-th line period, since the voltage of the scanning line Gi is in the high level, the transistors Q2, Q3 are turned on. At this time, the data line drive/current measurement circuit 14 applies the data voltage Dij to the data line Sj. Therefore, the gate-source voltage of the transistor Q1 is changed to (Vref−Dij).

At the end of the i-th line period, the voltage of the scanning line Gi is changed to the low level. With this, the transistors Q2, Q3 are turned off. After this, the gate-source voltage of the transistor Q1 is kept at (Vref−Dij) by an action of the capacitor C1. When the data voltage Dij is less than or equal to a predetermined level, the transistor Q1 is turned on, and a current of which amount corresponds to the gate-source voltage of the transistor Q1 flows through the organic EL element L1. The organic EL element L1 emits light at luminance in accordance with the amount of the flowing current.

In the vertical flyback period, the voltage of the scanning line Gi is changed to the high level. With this, the transistors Q2, Q3 are turned on. In the vertical flyback period except the ending part thereof, the data line drive/current measurement circuit 14 applies the measurement voltage Vmg(i,j) to the data line Sj. Therefore, the gate-source voltage of the transistor Q1 is changed to {Vref−Vmg(i,j)}. At this time, the transistor Q1 is turned on, and a current flows from an electrode having the high level power supply voltage ELVDD to the data line Sj passing through the transistors Q1, Q2. The data line drive/current measurement circuit 14 measures a current that is output from the data line Sj in the vertical flyback period except the ending part thereof.

In the ending part of the vertical flyback period, the data line drive/current measurement circuit 14 applies the data voltage Dij to the data line Sj. At this time, the pixel circuit 38 operates in the same manner as in the i-th line period. At the end of the vertical flyback period, the clear signal CLR is changed to the high level, and the period specifying signal PS is changed to the low level. With this, the voltage of the scanning line Gi is changed to the low level. After this, the organic EL element L1 emits light at luminance in accordance with the data voltage Dij.

Figure 18:
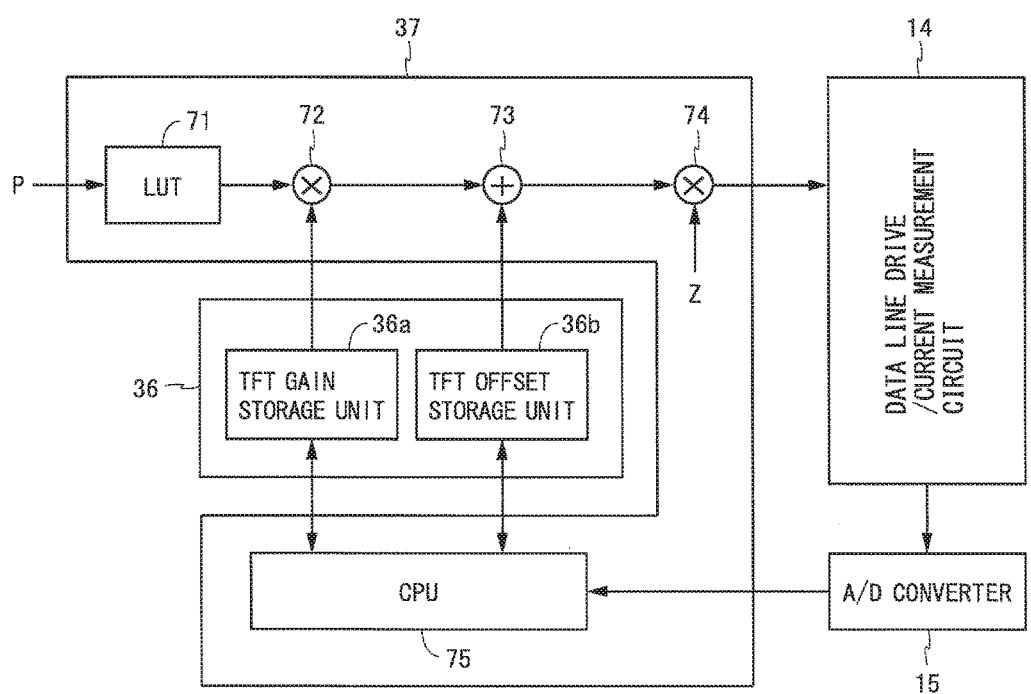
FIG. 18 is a block diagram showing details of a correction data storage unit and a correction calculation unit in the display device shown in FIG. 15.

FIG. 18 is a block diagram showing details of the correction data storage unit 36 and the correction calculation unit 37. As shown in FIG. 18, the correction data storage unit 36 includes a TFT gain storage unit 36a and a TFT offset storage unit 36b. The two storage units 36a, 36b store (m×n) pieces of correction data corresponding to the (m×n) pixel circuits 38, respectively. The TFT gain storage unit 36a stores TFT gains, and the TFT offset storage unit 36b stores TFT offsets.

The correction calculation unit 37 includes a LUT 71, multipliers 72, 74, an adder 73, and a CPU 75. A gradation P included in the video signal X1, a gradation P for detecting TFT characteristics, and the output of the A/D converter 15 are input to the correction calculation unit 37. Correction data with respect to the pixel circuit 38 in the i-th row and the j-th column is read out from the two storage units 36a, 36b.

The LUT 71 performs a gamma correction to the gradation P. The multiplier 72 multiplies an output of the LUT 71 by a TFT gain read out from the TFT gain storage unit 36a. The adder 73 adds a TFT offset read out from the TFT offset storage unit 36b, to an output of the multiplier 72. The multiplier 74 multiplies an output of the adder 73 by a coefficient Z for compensating for an attenuation of the data voltage. In the video signal period, the correction calculation unit 37 outputs to the data line drive/current measurement circuit 14 the video signal X2 including an output of the multiplier 74. In the vertical flyback period, the correction calculation unit 37 outputs the output of the multiplier 74 to the data line drive/current measurement circuit 14, as data corresponding to the measurement voltage Vmg(i,j).

Figure 19:
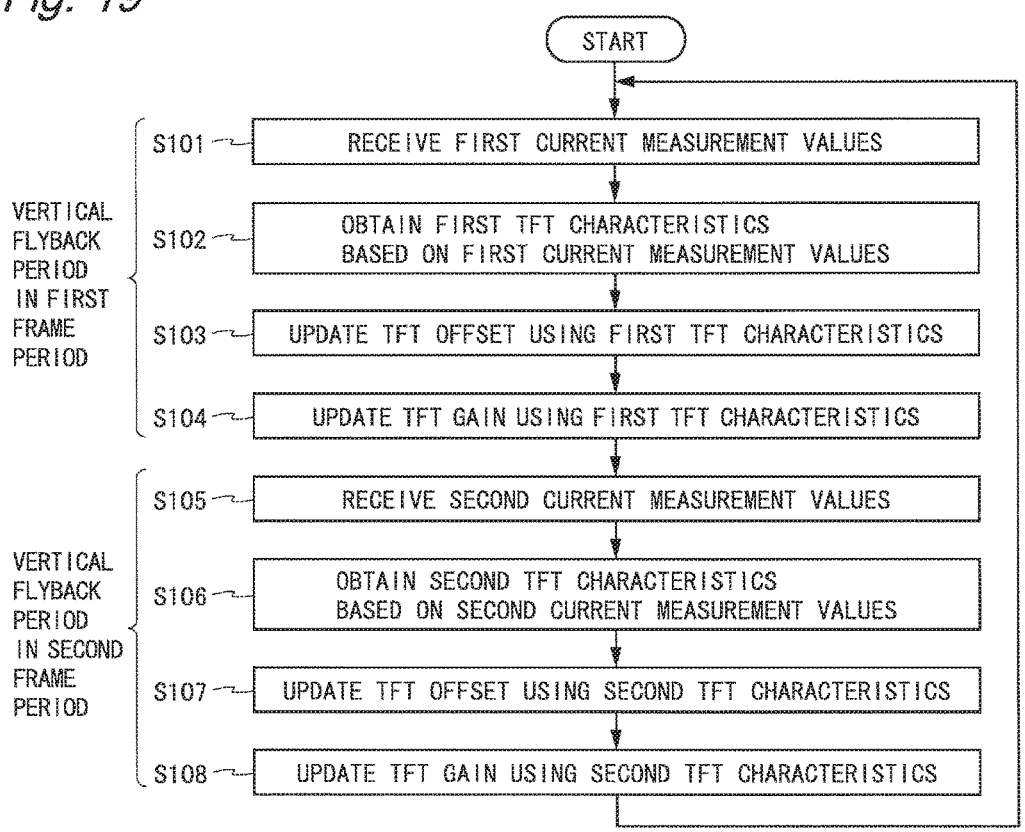
FIG. 19 is a flowchart showing an operation of a CPU in the display device shown in FIG. 15.

The CPU 75 updates correction data stored in the two storage unit 36a, 36b, based on the output of the A/D converter 15. FIG. 19 is a flowchart showing an operation of the CPU 75. The CPU 75 performs steps S101 to S108 shown in FIG. 19 every two frame periods. The CPU 75 performs steps S101 to S104 in the vertical flyback period in a first frame period, and performs steps S105 to S108 in the vertical flyback period in a second frame period. Steps S101 to S108 are the same as those in the first embodiment, except that the TFT offsets stored in the TFT offset storage unit 36b are updated in steps S103, S107, and the TFT gains stored in the TFT gain storage unit 36a are updated in steps S104, S108.

As shown above, the display control circuit 12 switches the line period in which the high level sampling signal SS is output, every two frame periods. Therefore, the scanning line drive circuit 23 switches the scanning line selected in the vertical flyback period, every two frame periods. In the first and second frame periods, the data line drive/current measurement circuit 14 measures a current that is output from the pixel circuit 38 to which one of the first and second measurement voltages is written, respectively. In the first and second frame periods, the correction calculation unit 37 updates correction data stored in the correction data storage unit 36, based on first and second current measurement values, respectively.

As described above, the display device 3 according to the present embodiment includes the display unit 31 including the n scanning lines G1 to Gn, the m data lines S1 to Sm, and the (m×n) pixel circuits 38 arranged two-dimensionally, the scanning line drive circuit 23, the data line drive circuit (data line drive/current measurement circuit 14), the display control circuit 12 configured to output the period specifying signal PS indicating whether it is in the video signal period or in the non-video signal period (vertical flyback period), and the sampling signal SS which is in the high level in one line period in the video signal period. The configuration of the scanning line drive circuit 23 is the same as that in the second embodiment.

The pixel circuit 38 includes the organic EL element L1 (electro-optical element), the transistor Q1 (drive transistor) provided in series with the organic EL element L1, the transistor Q2 (write control transistor) provided between the data line Sj and one conduction terminal (source terminal) of the transistor Q1, and having the gate terminal (control terminal) connected to the scanning line Gi, the transistor Q3 (reference voltage applying transistor) provided between the gate terminal of the transistor Q1 and the wiring having the reference voltage Vref, and having the gate terminal connected to the scanning line Gi, and the capacitor C1 provided between the gate terminal and the source terminal (one conduction terminal) of the transistor Q1.

According to the display device 3 of the present embodiment, in a display device having pixel circuits, each including an electro-optical element, three transistors, and a capacitor, and a wiring having a reference voltage, it is possible to select one scanning line corresponding to the pixel circuits in one row, and measure currents and write voltages with respect to the pixel circuits in one row in the vertical flyback period, by using a simple circuit. First to third variants can be configured also for the display device 3 according to the present embodiment, as with the first and second embodiment.

Fourth Embodiment

In the first to third embodiments, there are described display devices including a data line drive circuit having a function of measuring a current that is output from a pixel circuit when a measurement voltage is written to the pixel circuit. In a fourth embodiment, there will be described a display device including a data line drive circuit having a function of measuring a voltage of a node in a pixel circuit when a measurement current flows through the pixel circuit.

Figure 20:
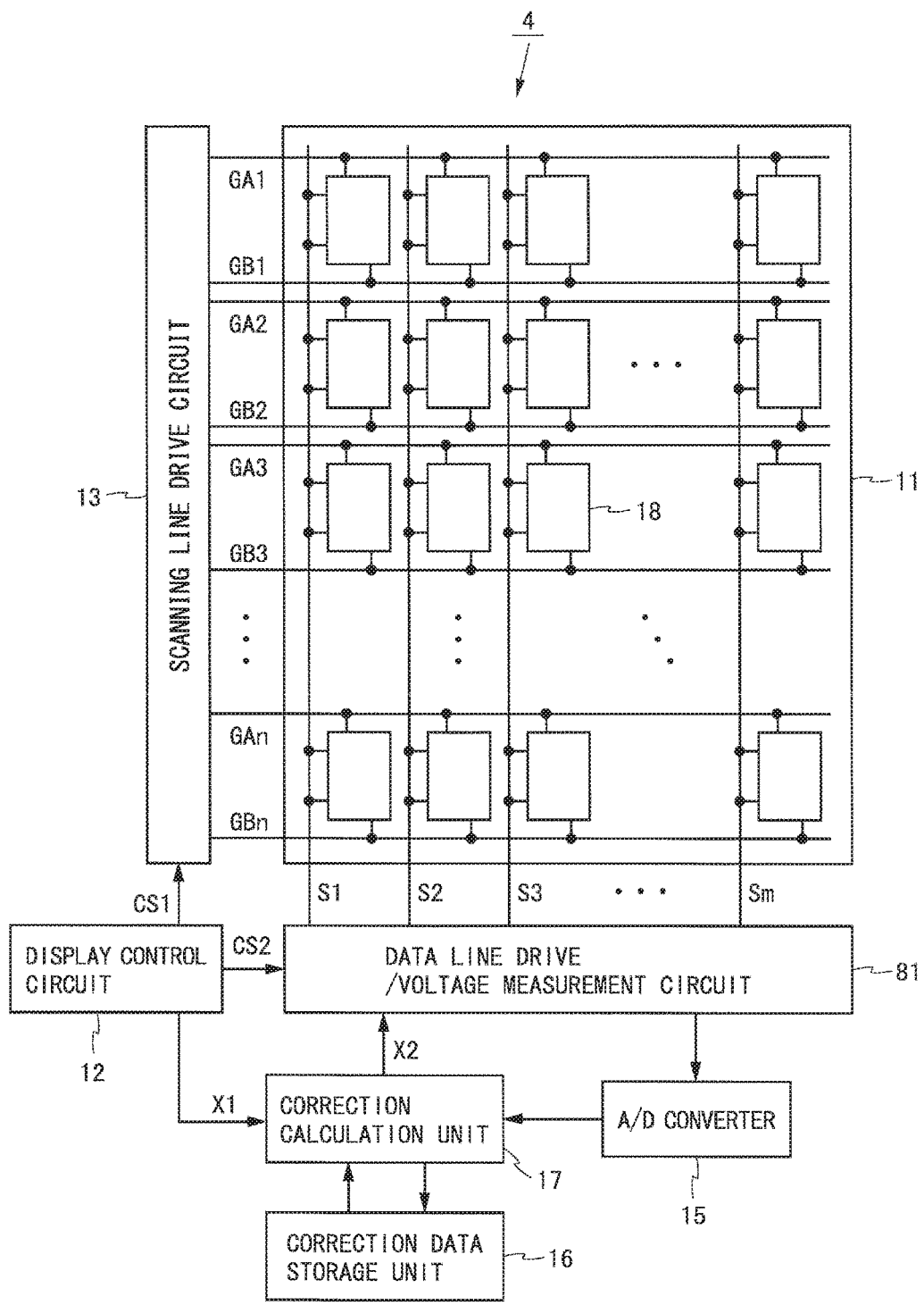
FIG. 20 is a block diagram showing a configuration of a display device according to a fourth embodiment of the present invention.

FIG. 20 is a block diagram showing a configuration of a display device according to the present embodiment. A display device 4 shown in FIG. 20 is obtained by replacing the data line drive/current measurement circuit 14 in the display device 1 according to the first embodiment with a data line drive/voltage measurement circuit 81. Of the components of the present embodiment, the same component as that of the first embodiment is provided with the same reference numeral and description thereof is omitted.

The data line drive/voltage measurement circuit 81 is a data line drive circuit having a function of driving the data lines S1 to Sm, and a function of measuring a voltage of a node in the pixel circuit 18. More specifically, in the video signal period, according to the control signal CS2, the data line drive/voltage measurement circuit 81 applies m data voltages in accordance with the video signal X2 to the data lines S1 to Sm. In the vertical flyback period, according to the control signal CS2, the data line drive/voltage measurement circuit 81 applies a predetermined voltage to the data lines S1 to Sm, and then measures the voltages of the data lines S1 to Sm when a measurement current (fixed current) flows through the data lines S1 to Sm. With this, the data line drive/voltage measurement circuit 81 measures a voltage of a node (node to which the source terminal of the transistor Q1 and the anode terminal of the organic EL element L1 are connected) in the pixel circuit 18.

Figure 21:
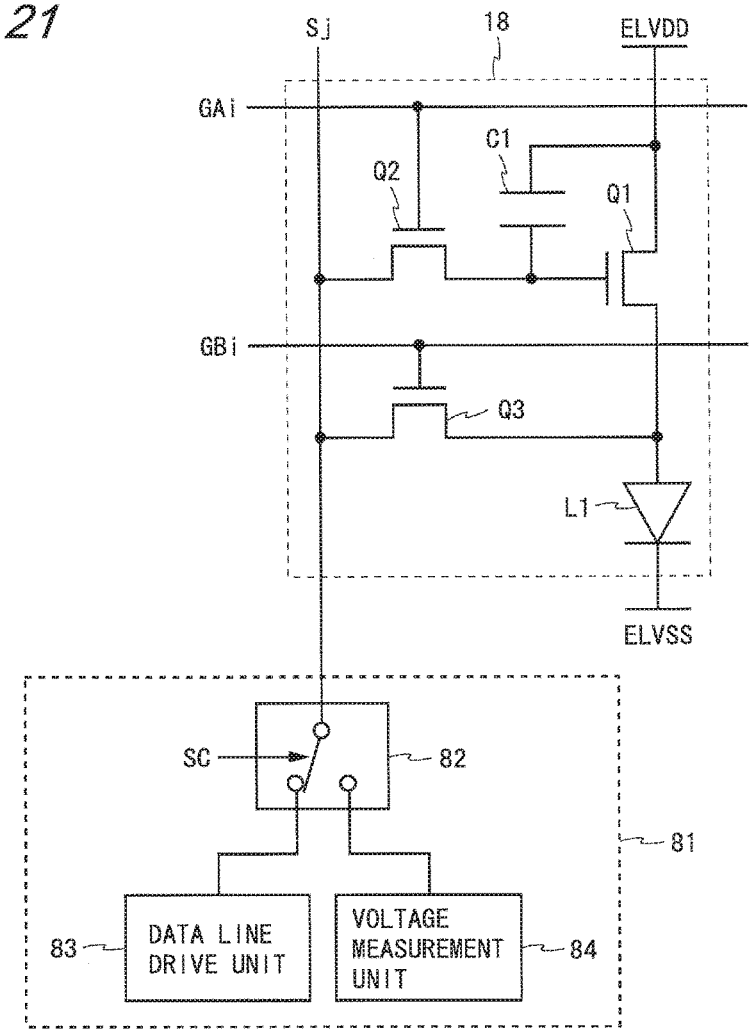
FIG. 21 is a block diagram showing details of a data line drive/voltage measurement circuit in the display device shown in FIG. 20.

FIG. 21 is a block diagram showing details of the data line drive/voltage measurement circuit 81. As shown in FIG. 21, the data line drive/voltage measurement circuit 81 includes a switch 82, a data line drive unit 83, and a voltage measurement unit 84, corresponding to the data line Sj. The switch 82 connects one of the data line drive unit 83 and the voltage measurement unit 84 to the data line Sj, in accordance with a selection signal SC.

Figure 22:
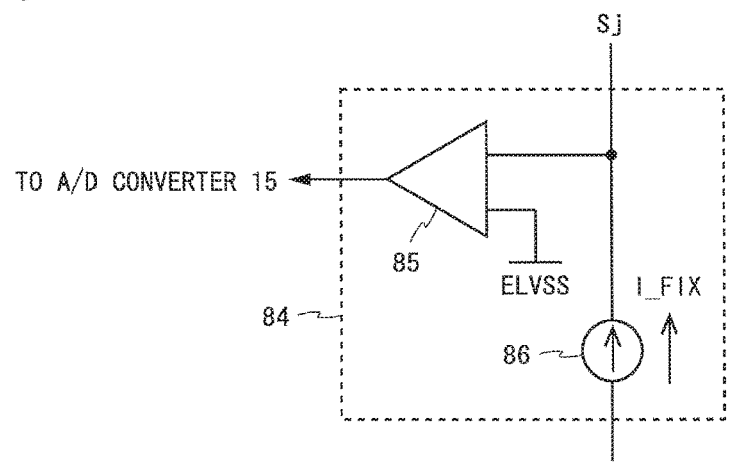
FIG. 22 is a circuit diagram showing a configuration example of a voltage measurement unit in the data line drive/voltage measurement circuit shown in FIG. 20.

FIG. 22 is a circuit diagram showing a configuration example of the voltage measurement unit 84. The voltage measurement unit 84 shown in FIG. 22 includes an amplifier 85 and a fixed current source 86. The low level power supply voltage ELVSS is fixedly applied to one input terminal of the amplifier 85. The other input terminal of the amplifier 85 and the fixed current source 86 are connected to the data line Sj via the switch 82. When the voltage measurement unit 84 is connected to the data line Sj, the fixed current source 86 makes a fixed current I_FIX flow to the data line Sj. At this time, the amplifier 85 amplifies a voltage of the data line Sj, and outputs the amplified voltage to the A/D converter 15.

Figure 23:
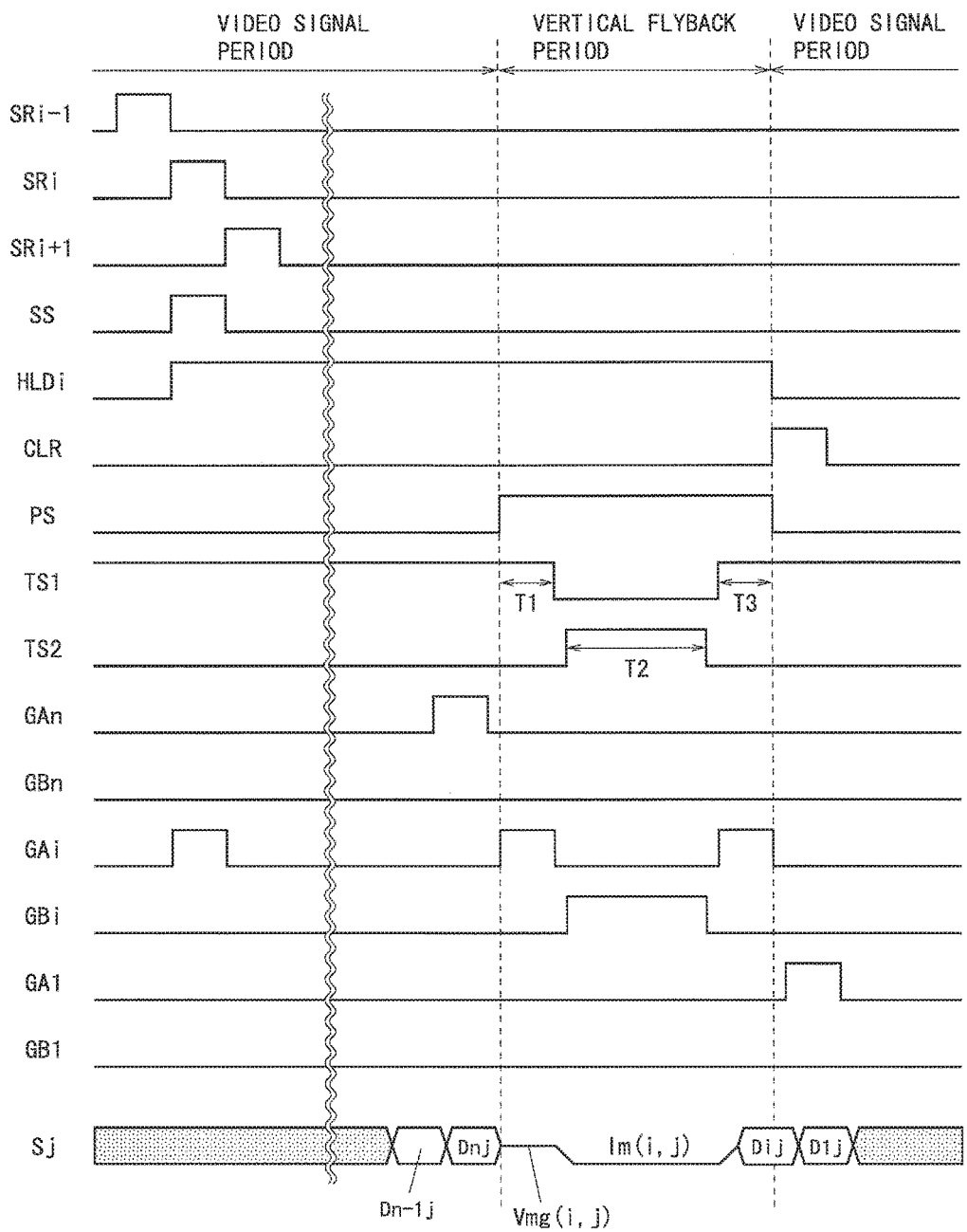
FIG. 23 is a detailed timing chart of the display device shown in FIG. 20.
Figure 24:
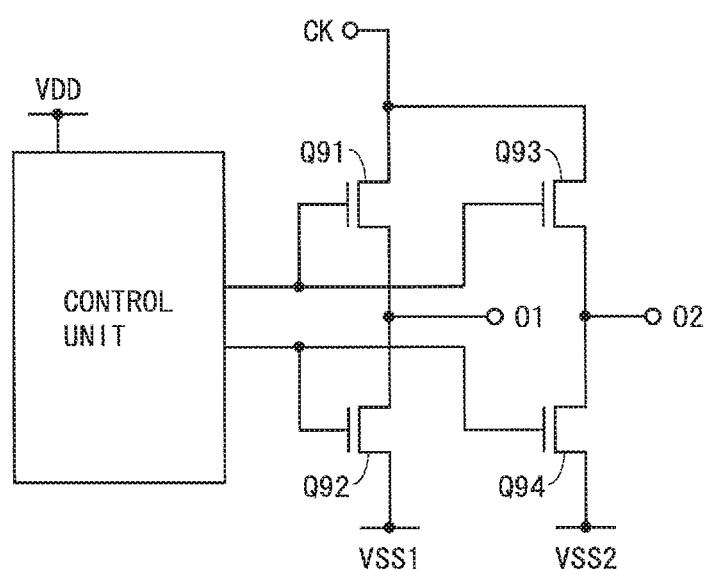
FIG. 24 is a diagram showing a pulse output circuit included in a conventional shift register.
Figure 25:
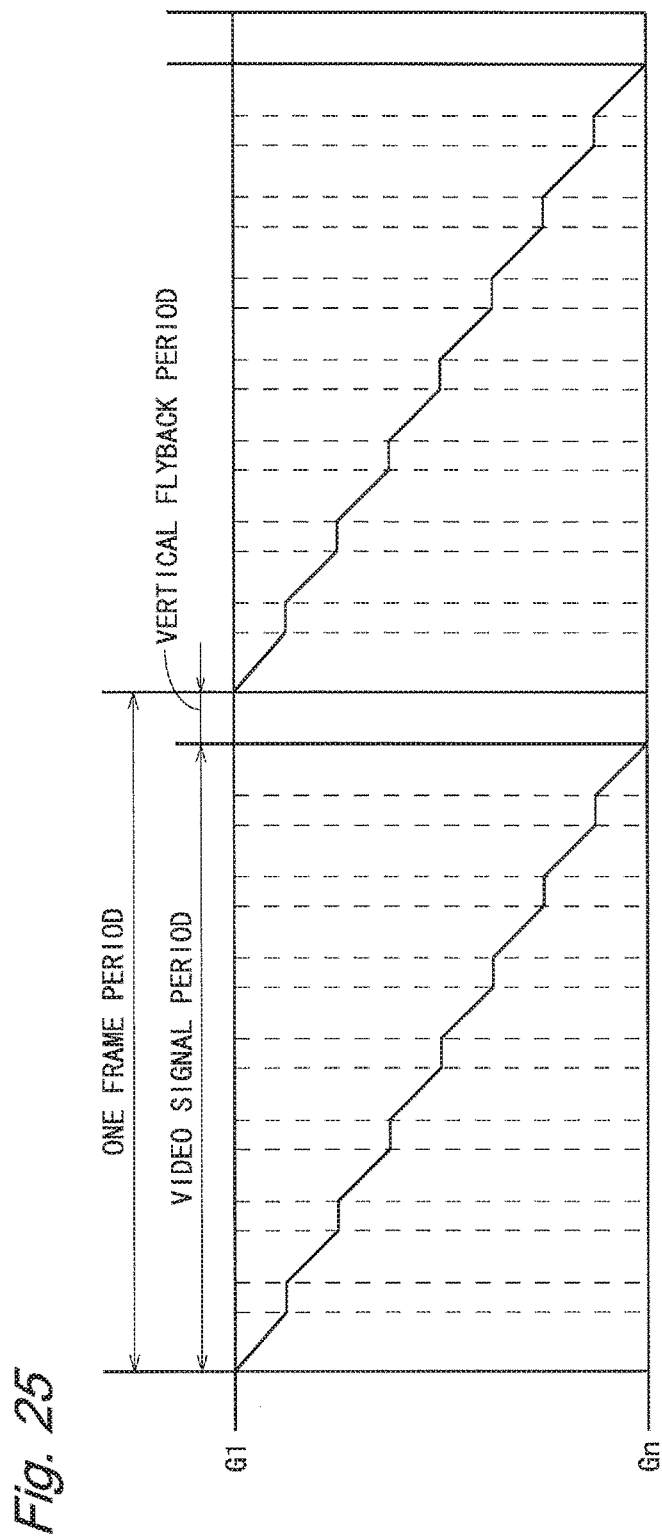
FIG. 25 is a timing chart of a display device having extended line periods.

As with the display device 1, the display device 4 operates according to the timing chart shown in FIG. 4. FIG. 23 is a detailed timing chart of the display device 4. The display device 4 and the display device 1 according to the first embodiment perform the same operation in the video signal period, and perform different operations in the vertical flyback period. Hereinafter, there will be described an operation of the pixel circuit 18 in an i-th row and a j-th column in the vertical flyback period shown in FIG. 23.

During the period T1, the voltage of the scanning line GAi is in the high level, and the voltage of the scanning line GBi is in the low level. Thus, the transistor Q2 is turned on, and the transistor Q3 is turned off. At this time, the data line drive/voltage measurement circuit 81 applies the measurement voltage Vmg(i,j) to the data line Sj. Therefore, the gate voltage of the transistor Q1 is changed to Vmg(i,j). The measurement voltage Vmg(i,j) is either a TFT characteristics measurement voltage or an OLED characteristics measurement voltage.

During the period T2, the voltage of the scanning line GAi is in the low level, the voltage of the scanning line GBi is in the high level. Thus, the transistor Q2 is turned off, and the transistor Q3 is turned on. Further, the fixed current I_FIX is supplied to the data line Sj in the period T2. The fixed current I_FIX flows from the pixel circuit 18 to the data line drive/voltage measurement circuit 81 when the TFT characteristics is to be measured, and flows in the opposite direction when the OLED characteristics is to be measured.

The fixed current I_FIX and the TFT characteristics measurement voltage Vmg(i,j) are set so that a voltage of the anode terminal of the organic EL element L1 (that is, voltage measured when the TFT characteristics is to be measured) is less than or equal to a threshold voltage of the organic EL element L1 in the period T2. Thus, when the TFT characteristics measurement voltage has been applied to the data line Sj in the period T1, a current flows from an electrode having the high level power supply voltage ELVDD to the data line Sj passing through the transistors Q1, Q3 in the period T2. No current flows through the organic EL element L1 at this time. Therefore, characteristics of the transistor Q1 can be measured alone by using the TFT characteristics measurement voltage.

Further, the fixed current I_FIX and the OLED characteristics measurement voltage Vmg(i,j) are set so that a difference between the OLED characteristics measurement voltage Vmg(i,j) and a voltage of the source terminal of the transistor Q1 in the period T2 (that is, measured voltage when the OLED characteristics is to be measured) is less than or equal to a threshold voltage of the transistor Q1. Thus, when the OLED characteristics measurement voltage has been applied to the data line Sj in the period T1, a current flows from the data line Sj to an electrode having the low level power supply voltage ELVSS passing through the transistor Q3 and the organic EL element L1 in the period T2. The transistor Q1 is not turned on at this time. Therefore, characteristics of the organic EL element L1 can be measured alone by using the OLED characteristic measurement voltage.

During the period T2, since the transistor Q3 is turned on, the voltage of the data line Sj is equal to a voltage of the node to which the source terminal of the transistor Q1 and the anode terminal of the organic EL element L1 are connected. In the period T2, the data line drive/voltage measurement circuit 81 measures the voltage of the data line Sj to measure the voltage of the node (node to which the source terminal of the transistor Q1 and the anode terminal of the organic EL element L1 are connected) in the pixel circuit 18.

During the period T3, the voltage of the scanning line GAi is in the high level, the voltage of the scanning line GBi is in the low level. At this time, the data line drive/voltage measurement circuit 81 and the pixel circuit 18 operate in a manner similar to the i-th line period. After the period T3, the organic EL element L1 emits light at luminance in accordance with the data voltage Dij.

As described above, the display device 4 according to the present embodiment includes the display unit 11, the scanning line drive circuit 13, the data line drive circuit (data line drive/voltage measurement circuit 81) having a function of measuring a voltage of a node (node to which the source terminal of the transistor Q1 and the anode terminal of the organic EL element L1 are connected) in the pixel circuit 18 when a measurement current (fixed current from the fixed current source 86) flows through the pixel circuit 18, and the display control circuit 12. The configurations of the display unit 11, the display control circuit 12, and the scanning line drive circuit 13 are the same as those in the first embodiment. As thus described, also according to the display device 4 including the scanning line drive circuit 13 and measuring voltage with respect to the pixel circuit 18, as with the display device 1 including the scanning line drive circuit 13 and measuring current with respect to the pixel circuit 18, it is possible to select one scanning line corresponding to the pixel circuits in one row, and measure voltages (voltages at nodes in the pixel circuits when the measurement current flows through the pixel circuits) with respect to the pixel circuits in one row in the vertical flyback period, by using a simple circuit.

There is described herein about the display device 4 including the scanning line drive circuit 13 and a data line drive circuit (data line drive/voltage measurement circuit 81) having a function of measuring a voltage with respect to the pixel circuit 18, and having a configuration similar to that of the display device 1. Similarly, there may be configured a display device including the scanning line drive circuit 23 and a data line drive circuit having a function of measuring a voltage with respect to the pixel circuit 28, and having a configuration similar to that of the display device 2, or a display device including the scanning line drive circuit 23 and a data line drive circuit having a function of measuring a voltage with respect to the pixel circuit 38, and having a configuration similar to that of the display device 3.

As described above, according to the display device of the present invention, it is possible to select the scanning line corresponding to the pixel circuits in one row in the vertical flyback period, and measure currents or voltages with respect to the pixel circuits in one row, by using a simple circuit. Note that by arbitrarily combining the features of the display devices of the first to fourth embodiments and their variants unless contrary to the nature thereof, it is possible to configure a display device having features of the plurality of the embodiments or the variants.

Note that driving methods of the display devices according to the first to third embodiments can be described as follows.

First Embodiment

A driving method of an active-matrix type display device having a display unit including a plurality of first scanning lines, a plurality of second scanning lines, a plurality of data lines, and a plurality of pixel circuits arranged two-dimensionally, the method comprising the steps of:
  driving the scanning lines by using a scanning line drive circuit;
  driving the data lines and measuring a current or a voltage with respect to the pixel circuit; and
  outputting a period specifying signal indicating whether it is in a video signal period or in a non-video signal period, a sampling signal which is in an active level in one line period in the video signal period, a first timing signal which is in a non-selection level in apart of the non-video signal period, and is in a selection level otherwise, and a second timing signal which is in the selection level in a part of a period in which the first timing signal is in the non-selection level, and is in the non-selection level otherwise, wherein the scanning line drive circuit includes
a shift register having a plurality of stages corresponding to the scanning lines,
a plurality of hold circuits provided corresponding to the scanning lines, each configured to hold a shift register output in accordance with the sampling signal, the shift register output being output from a corresponding stage of the shift register, and
a scanning signal output circuit provided corresponding to the scanning lines, and configured to output a scanning signal to be applied to a corresponding scanning line, based on at least the period specifying signal, the shift register output, and a hold output which is output from a corresponding hold circuit, the pixel circuit includes
an electro-optical element,
a drive transistor provided in series with the electro-optical element,
a write control transistor provided between the data line and a control terminal of the drive transistor, and having a control terminal connected to the first scanning line,
a read control transistor provided between the data line and one conduction terminal of the drive transistor, and having a control terminal connected to the second scanning line, and
a capacitor provided between the control terminal and the other conduction terminal of the drive transistor, and in the step of driving the scanning lines, in the video signal period using the scanning signal output circuit, the shift register output is output as a first scanning signal to be applied to the first scanning line and a non-selection level signal is output as a second scanning signal to be applied to the second scanning line, to output a scanning signal for writing when the shift register output is in the selection level, and in the non-video signal period using the scanning signal output circuit, a signal is output as the first scanning signal, the signal being in the selection level when the hold output and the first timing signal are in the selection level, and another signal is output as the second scanning signal, the another signal being in the selection level when the hold output and the second timing signal are in the selection level, to output a scanning signal for measurement and writing when the hold output is in the selection level.

Second Embodiment

A driving method of an active-matrix type display device having a display unit including a plurality of scanning lines, a plurality of data lines, a plurality of monitor lines, and a plurality of pixel circuits arranged two-dimensionally, the method comprising the steps of:
driving the scanning lines by using a scanning line drive circuit;
driving the data lines and measuring a current or a voltage with respect to the pixel circuit; and
outputting a period specifying signal indicating whether it is in a video signal period or in a non-video signal period and a sampling signal which is in an active level in one line period in the video signal period, wherein
the scanning line drive circuit includes
a shift register having a plurality of stages corresponding to the scanning lines,
a plurality of hold circuits provided corresponding to the scanning lines, each configured to hold a shift register output in accordance with the sampling signal, the shift register output being output from a corresponding stage of the shift register, and
a scanning signal output circuit provided corresponding to the scanning lines, and configured to output a scanning signal to be applied to a corresponding scanning line, based on at least the period specifying signal, the shift register output, and a hold output which is output from a corresponding hold circuit, the pixel circuit includes
an electro-optical element,
a drive transistor provided in series with the electro-optical element,
a write control transistor provided between the data line and a control terminal of the drive transistor, and having a control terminal connected to the scanning line,
a read control transistor provided between the monitor line and one conduction terminal of the drive transistor, and having a control terminal connected to the scanning line, and
a capacitor provided between the control terminal and the one conduction terminal of the drive transistor, and in the step of driving the scanning lines, in the video signal period using the scanning signal output circuit, the shift register output is output to output a scanning signal for writing when the shift register output is in a selection level, and in the non-video signal period using the scanning signal output circuit, the hold output is output to output a scanning signal for measurement and writing when the hold output is in the selection level.

Third Embodiment

A driving method of an active-matrix type display device having a display unit including a plurality of scanning lines, a plurality of data lines, and a plurality of pixel circuits arranged two-dimensionally, the method comprising the steps of:
driving the scanning lines by using a scanning line drive circuit;
driving the data lines and measuring a current or a voltage with respect to the pixel circuit; and
outputting a period specifying signal indicating whether it is in a video signal period or in a non-video signal period and a sampling signal which is in an active level in one line period in the video signal period, wherein
the scanning line drive circuit includes
a shift register having a plurality of stages corresponding to the scanning lines,
a plurality of hold circuits provided corresponding to the scanning lines, each configured to hold a shift register output in accordance with the sampling signal, the shift register output being output from a corresponding stage of the shift register, and
a scanning signal output circuit provided corresponding to the scanning lines, and configured to output a scanning signal to be applied to a corresponding scanning line, based on at least the period specifying signal, the shift register output, and a hold output which is output from a corresponding hold circuit, the pixel circuit includes
an electro-optical element,
a drive transistor provided in series with the electro-optical element,
a write control transistor provided between the data line and one conduction terminal of the drive transistor, and having a control terminal connected to the scanning line,
a reference voltage applying transistor provided between a control terminal of the drive transistor and a wiring having a reference voltage, and having a control terminal connected to the scanning line, and
a capacitor provided between the control terminal and the one conduction terminal of the drive transistor, and in the step of driving the scanning lines, in the video signal period using the scanning signal output circuit, the shift register output is output to output a scanning signal for writing when the shift register output is in a selection level, and in the non-video signal period using the scanning signal output circuit, the hold output is output to output a scanning signal for measurement and writing when the hold output is in the selection level.

INDUSTRIAL APPLICABILITY

The display device and the driving method of the display device of the present invention have a feature that one scanning line can be selected in a vertical flyback period, and currents or voltages can be measured with respect to the pixel circuits in one row, by using a simple circuit. Therefore, they are applicable to various types of active-matrix type display devices including an electro-optical element such as an organic EL element and the like.

DESCRIPTION OF REFERENCE CHARACTERS 1, 2, 3, 4: DISPLAY DEVICE
11, 21, 31: DISPLAY UNIT
12: DISPLAY CONTROL CIRCUIT
13, 19, 23: SCANNING LINE DRIVE CIRCUIT
14: DATA LINE DRIVE/CURRENT MEASUREMENT CIRCUIT
16, 36: CORRECTION DATA STORAGE UNIT
17, 37: CORRECTION CALCULATION UNIT
18, 28, 38: PIXEL CIRCUIT
41: SHIFT REGISTER
42: HOLD CIRCUIT
43, 53: SCANNING SIGNAL OUTPUT CIRCUIT
81: DATA LINE DRIVE/VOLTAGE MEASUREMENT CIRCUIT
G1 to Gn, GA1 to GAn, GB1 to GBn: SCANNING LINE
S1 to Sm: DATA LINE
M1 to Mm: MONITOR LINE
L1: ORGANIC EL ELEMENT
Q1 to Q3: TRANSISTOR
C1: CAPACITOR
CLR: CLEAR SIGNAL
PS: PERIOD SPECIFYING SIGNAL
SS: SAMPLING SIGNAL
TS1, TS2: TIMING SIGNAL

The invention claimed is:

1. An active-matrix type display device comprising:
a display unit including a plurality of scanning lines, a plurality of data lines, and a plurality of pixel circuits arranged two-dimensionally;
a scanning line drive circuit configured to drive the scanning lines;
a data line drive circuit configured to have a function of driving the data lines and a function of measuring a current or a voltage with respect to the pixel circuit; and
a display control circuit configured to output a period specifying signal indicating whether it is in a video signal period or in a non-video signal period and a sampling signal which is in an active level in one line period in the video signal period, wherein
the scanning line drive circuit includes
a shift register having a plurality of stages corresponding to the scanning lines,
a plurality of hold circuits provided corresponding to the scanning lines, each configured to hold a shift register output in accordance with the sampling signal, the shift register output being output from a corresponding stage of the shift register, and
a scanning signal output circuit provided corresponding to the scanning lines, and configured to output a scanning signal to be applied to a corresponding scanning line, based on at least the period specifying signal, the shift register output, and a hold output which is output from a corresponding hold circuit.

2. The display device according to claim 1, wherein the scanning signal output circuit is configured to output a scanning signal for writing when the shift register output is in a selection level in the video signal period, and output a scanning signal for measurement and writing when the hold output is in the selection level in the non-video signal period.

3. The display device according to claim 2, wherein
the plurality of the scanning lines includes a plurality of first scanning lines and a plurality of second scanning lines,
the display control circuit is configured to further output a first timing signal and a second timing signal, and
the scanning signal output circuit is configured to output the shift register output as a first scanning signal to be applied to the first scanning line and output a non-selection level signal as a second scanning signal to be applied to the second scanning line in the video signal period, and is configured to output as the first scanning signal a signal based on the hold output and the first timing signal and output as the second scanning signal a signal based on the hold output and the second timing signal in the non-video signal period.

4. The display device according to claim 3, wherein
the pixel circuit includes
an electro-optical element,
a drive transistor provided in series with the electro-optical element,
a write control transistor provided between the data line and a control terminal of the drive transistor, and having a control terminal connected tO the first scanning line,
a read control transistor provided between the data line and one conduction terminal of the drive transistor, and having a control terminal connected to the second scanning line, and
a capacitor provided between the control terminal and the other conduction terminal of the drive transistor.

5. The display device according to claim 4, wherein
the first timing signal is in a non-selection level in a part of the non-video signal period, and is in the selection level otherwise,
the second timing signal is in the selection level in a part of a period in which the first timing signal is in the non-selection level, and is in the non-selection level otherwise, and
the scanning signal output circuit is configured to, in the non-video signal period, output as the first scanning signal a signal which is in the selection level when the hold output and the first timing signal are in the selection level, and output as the second scanning signal a signal which is in the selection level when the hold output and the second timing signal are in the selection level.

6. The display device according to claim 2, wherein the scanning signal output circuit is configured to output the shift register output as the scanning signal in the video signal period, and output the hold output as the scanning signal in the non-video signal period.

7. The display device according to claim 6, wherein
the display unit further includes a plurality of monitor lines, and
the pixel circuit includes
an electro-optical element,
a drive transistor provided in series with the electro-optical element,
a write control transistor provided between the data line and a control terminal of the drive transistor, and having a control terminal connected to the scanning line,
a read control transistor provided between the monitor line and one conduction terminal of the drive transistor, and having a control terminal connected to the scanning line, and
a capacitor provided between the control terminal and the one conduction terminal of the drive transistor.

8. The display device according to claim 6, wherein
the pixel circuit includes
an electro-optical element,
a drive transistor provided in series with the electro-optical element,
a write control transistor provided between the data line and one conduction terminal of the drive transistor, and having a control terminal connected to the scanning line,
a reference voltage applying transistor provided between a control terminal of the drive transistor and a wiring having a reference voltage, and having a control terminal connected to the scanning line, and
a capacitor provided between the control terminal and the one conduction terminal of the drive transistor.

9. The display device according to claim 2, wherein
the display control circuit is configured to further output a clear signal which is changed to the active level at the end of the non-video signal period, and
an output of the hold circuit is changed to a non-selection level in accordance with the clear signal.

10. The display device according to claim 2, wherein the display control circuit is configured to switch a line period in which an active level sampling signal is output, every plural frame periods.

11. The display device according to claim 10, wherein the display control circuit is configured to switch the line period in which the active level sampling signal is output, every plural frame periods sequentially.

12. The display device according to claim 10, wherein the display control circuit is configured to switch the line period in which the active level sampling signal is output, every plural frame periods sequentially with skipping a predetermined number of line periods.

13. The display device according to claim 10, wherein the display control circuit is configured to switch the line period in which the active level sampling signal is output, every plural frame periods at random.

14. The display device according to claim 10, wherein the display control circuit is configured to switch the line period in which the active level sampling signal is output, every plural frame periods with giving a priority to line periods in a specific range.

15. The display device according to claim 2, wherein the data line drive circuit is configured to apply to the data line a voltage corrected according to luminance drop of the pixel circuit when writing the voltage to the pixel circuit selected in the non-video signal period from among the plurality of the pixel circuits.

16. The display device according to claim 2, further comprising a correction calculation unit configured to correct a video signal based on the current or the voltage measured by the data line drive circuit.

17. The display device according to claim 2, wherein the data line drive circuit is configured to measure a current that is output from the pixel circuit when a measurement voltage is written to the pixel circuit.

18. The display device according to claim 2, wherein the data line drive circuit is configured to measure a voltage of a node in the pixel circuit when a measurement current flows through the pixel circuit.

19. A driving method of an active-matrix type display device having a display unit including a plurality of scanning lines, a plurality of data lines, and a plurality of pixel circuits arranged two-dimensionally, the method comprising the steps of:
driving the scanning lines by using a scanning line drive circuit;
driving the data lines and measuring a current or a voltage with respect to the pixel circuit; and
outputting a period specifying signal indicating whether it is in a video signal period or in a non-video signal period and a sampling signal which is in an active level in one line period in the video signal period, wherein
the scanning line drive circuit includes
a shift register having a plurality of stages corresponding to the scanning lines,
a plurality of hold circuits provided corresponding to the scanning lines, each configured to hold a shift register output in accordance with the sampling signal, the shift register output being output from a corresponding stage of the shift register, and
a scanning signal output circuit provided corresponding to the scanning lines, and configured to output a scanning signal to be applied to a corresponding scanning line, based on at least the period specifying signal, the shift register output, and a hold output which is output from a corresponding hold circuit.

* * * * *